United States Patent
Arayama et al.

(10) Patent No.: US 10,901,123 B2
(45) Date of Patent: Jan. 26, 2021

(54) CURABLE COMPOSITION, CURED FILM, NEAR INFRARED CUT FILTER, CAMERA MODULE AND METHOD FOR MANUFACTURING CAMERA MODULE

(71) Applicant: FUJIFILM CORPORATION, Tokyo (JP)

(72) Inventors: Kyohei Arayama, Haibara-gun (JP); Satoru Murayama, Haibara-gun (JP); Hidenori Takahashi, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 739 days.

(21) Appl. No.: 14/963,529

(22) Filed: Dec. 9, 2015

(65) Prior Publication Data
US 2016/0091643 A1 Mar. 31, 2016

Related U.S. Application Data

(63) Continuation of application No. PCT/JP2014/065192, filed on Jun. 9, 2014.

(30) Foreign Application Priority Data

Jun. 12, 2013 (JP) ................................. 2013-124195
Jun. 3, 2014 (JP) ................................. 2014-114847

(51) Int. Cl.
*G02B 1/10* (2015.01)
*G02B 5/20* (2006.01)
(Continued)

(52) U.S. Cl.
CPC ............ *G02B 5/208* (2013.01); *C08K 5/0041* (2013.01); *C08K 5/3415* (2013.01);
(Continued)

(58) Field of Classification Search
CPC .......... G02B 5/208; G02B 5/223; G02B 1/10; C08K 5/3415; G03F 7/0007
See application file for complete search history.

(56) References Cited

U.S. PATENT DOCUMENTS 5,085,975 A 2/1992 Mueller
8,303,863 B2 * 11/2012 Nii ....................... C07D 487/04
106/311
(Continued)

FOREIGN PATENT DOCUMENTS

JP 61-22048 A 1/1986
JP 2003-147037 A 5/2003
(Continued)

OTHER PUBLICATIONS

Office Action dated Nov. 2, 2017 issued by the Korean Intellectual Property Office in counterpart Korean Application No. 10-2015-7034841.
(Continued)

*Primary Examiner* — Bijan Ahvazi
(74) *Attorney, Agent, or Firm* — Sughrue Mion, PLLC

(57) ABSTRACT

A curable composition which can be used to produce a cured film that does not easily allow a near infrared-absorbing pigment to be eluted even when the cured film is immersed in a solvent is provided. A cured film, a near infrared cut filter, a camera module, and a method for manufacturing a camera module are also provided. The curable composition includes: a near infrared-absorbing pigment (A) and a curable compound (B) having one or more atoms or groups selected from a fluorine atom, a silicon atom, a linear alkyl group having 8 or more carbon atoms, and a branched alkyl group having 3 or more carbon atoms.

32 Claims, 4 Drawing Sheets

(51) Int. Cl.
*G02B 5/22* (2006.01)
*G03F 7/00* (2006.01)
*C08K 5/3415* (2006.01)
*C09D 7/40* (2018.01)
*H01L 31/0216* (2014.01)
*C08K 5/00* (2006.01)
*H01L 27/146* (2006.01)
*C08K 5/3417* (2006.01)
*H01L 31/0232* (2014.01)
*C09D 5/32* (2006.01)

(52) U.S. Cl.
CPC .............. *C08K 5/3417* (2013.01); *C09D 5/32* (2013.01); *C09D 7/40* (2018.01); *G02B 1/10* (2013.01); *G02B 5/223* (2013.01); *G03F 7/0007* (2013.01); *H01L 27/14618* (2013.01); *H01L 31/02162* (2013.01); *H01L 31/02325* (2013.01)

(56) References Cited

U.S. PATENT DOCUMENTS

| | | | | |
|---|---|---|---|---|
| 8,603,370 | B2* | 12/2013 | Kato | C09B 57/004 252/587 |
| 9,150,670 | B2 | 10/2015 | Kato et al. | |
| 2009/0078673 | A1* | 3/2009 | Kihara | B82Y 10/00 216/11 |
| 2010/0249261 | A1* | 9/2010 | Yokoi | C09D 11/101 522/39 |
| 2011/0014401 | A1* | 1/2011 | Fujimaki | C08F 265/04 428/1.33 |
| 2011/0042653 | A1* | 2/2011 | Glodde | G03F 7/091 257/40 |
| 2011/0070407 | A1 | 3/2011 | Kato et al. | |
| 2011/0195235 | A1 | 8/2011 | Kato et al. | |
| 2012/0068292 | A1 | 3/2012 | Ikeda et al. | |
| 2012/0182638 | A1* | 7/2012 | Takakuwa | C09B 67/0069 359/892 |

FOREIGN PATENT DOCUMENTS

| | | |
|---|---|---|
| JP | 2004-115718 A | 4/2004 |
| JP | 2007-246696 A | 9/2007 |
| JP | 2008-303400 A | 12/2008 |
| JP | 2009-203321 A | 9/2009 |
| JP | 2010-090313 A | 4/2010 |
| JP | 2011-68731 A | 4/2011 |
| JP | 2012-207106 A | 10/2012 |
| JP | 2012-237985 A | 12/2012 |
| TW | 201219978 A | 5/2012 |
| WO | 2010/041769 A1 | 4/2010 |

OTHER PUBLICATIONS

International Search Report of PCT/JP2014/065192, dated Aug. 19, 2014. [PCT/ISA/210].
Written Opinion of PCT/JP2014/065192, dated Aug. 19, 2014. [PCT/ISA/237].
Office Action dated Nov. 23, 2016, from the State Intellectual Property Office of People's Republic of China in counterpart Chinese Application No. 201480033162.3.
Office Action dated Jul. 4, 2017 from the State Intellectual Property Office of the P.R.C. in counterpart Chinese Application No. 201480033162.3.
Office Action dated Dec. 25, 2017, issued by the Taiwanese Intellectual Property Office in counterpart Taiwanese Application No. 103120266.
Office Action dated Jul. 24, 2018 from the Korean Intellectual Property Office in counterpart Korean Application No. 10-2015-7034841.
International Preliminary Report on Patentability dated Dec. 23, 2015 in PCT/JP2014/065192.
Office Action dated Aug. 23, 2016, from the Japanese Patent Office in counterpart Japanese Application No. 2014-114847.
Office Action dated May 24, 2016, issued by the Japan Patent Office in corresponding Japanese Application No. 2014-114847.
Extended European Search Report dated Jun. 24, 2016, issued by the European Patent Office in corresponding European Application No. 14810700.6.
Office Action dated Sep. 13, 2017 from the Taiwanese Intellectual Property Office in counterpart Taiwanese Application No. 103120266.
Communication dated Jun. 3, 2020, from the European Patent Office in European Application No. 14810700.6.

* cited by examiner

CURABLE COMPOSITION, CURED FILM, NEAR INFRARED CUT FILTER, CAMERA MODULE AND METHOD FOR MANUFACTURING CAMERA MODULE

CROSS-REFERENCE TO RELATED APPLICATIONS

This application is a Continuation of PCT International Application No. PCT/JP2014/065192 filed on Jun. 9, 2014, which claims priority under 35 U.S.C § 119(a) to Japanese Patent Application No. 2013-124195 filed on Jun. 12, 2013 and Japanese Patent Application No. 2014-114847 filed on Jun. 3, 2014. Each of the above application(s) is hereby expressly incorporated by reference, in its entirety, into the present application.

BACKGROUND OF THE INVENTION

1. Field of the Invention

The present invention relates to a curable composition, a cured film, a near infrared cut filter, a camera module, and a method for manufacturing a camera module.

2. Description of the Related Art

For use of a near infrared cut filter for a solid-state imaging element such as a plasma display panel (PDP) or CCD, a near infrared-absorbing pigment is used.

As a composition for forming the near infrared cut filter, for example, a curable composition including a near infrared-absorbing pigment is used in JP2011-68731A. In addition, JP2007-246696A describes a curable composition for coating.

SUMMARY OF THE INVENTION

As a result of studies by the present inventors, it was found that, when a cured film is produced using a certain curable composition of the related art including a near infrared-absorbing pigment and is immersed in a solvent, there are cases in which the near infrared-absorbing pigment is eluted.

An object of the present invention is to provide a curable composition which can be used to produce a cured film that does not easily allow a near infrared-absorbing pigment to be eluted even when the cured film is immersed in a solvent.

As a result of intensive studies on the basis of the above-described circumferences, the present inventors found that, when a curable compound having one or more atoms or groups selected from a fluorine atom, a silicon atom, a linear alkyl group having 8 or more carbon atoms, and a branched alkyl group having 3 or more carbon atoms is formulated into a curable composition, the above-described problem can be solved.

Specifically, the above-described problem can be solved using the following means <1> and preferably <2> to <27>.

<1> A curable composition including: a near infrared-absorbing pigment (A) and a curable compound (B) having one or more atoms or groups selected from a fluorine atom, a silicon atom, a linear alkyl group having 8 or more carbon atoms, and a branched alkyl group having 3 or more carbon atoms.

<2> A curable composition including: a near infrared-absorbing pigment (A) and a curable compound (B) having a hydrophobic group.

<3> The curable composition according to <1> or <2>, in which the curable compound (B) has a fluorine atom and/or a branched alkyl group having 6 or more carbon atoms.

<4> The curable composition according to any one of <1> to <3>, in which the curable compound (B) has one or more curable functional groups selected from a (meth)acryloyloxy group, an epoxy group, an oxetanyl group, an isocyanate group, a hydroxyl group, an amino group, a carboxyl group, a thiol group, an alkoxysilyl group, a methylol group, a vinyl group, a (meth)acrylamide group, a styryl group, and a maleimide group.

<5> The curable composition according to <4>, in which the curable compound (B) has one or more curable functional groups selected from a (meth)acryloyloxy group, an epoxy group, and an oxetanyl group.

<6> The curable composition according to any one of <1> to <5>, in which the curable compound (B) has two or more curable functional groups.

<7> The curable composition according to any one of <1> to <6>, in which the curable compound (B) is a polymer having at least a repeating unit represented by Formula (B1) below and Formula (B2) below;

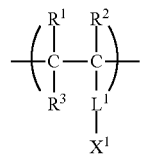

Formula (B1)

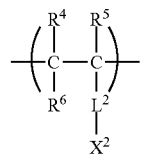

Formula (B2)

in Formulae (B1) and (B2), each of $R^1$ to $R^6$ independently represents a hydrogen atom, an alkyl group, or a halogen atom, each of $L^1$ and $L^2$ independently represents a single bond or a divalent linking group, $X^1$ represents a (meth)acryloyloxy group, an epoxy group, or an oxetanyl group, and $X^2$ represents an alkyl group substituted with a fluorine atom, an aryl group substituted with a fluorine atom, an alkylsilyl group, an arylsilyl group, a group having the following partial structure (S), a linear alkyl group having 8 or more carbon atoms, or a branched alkyl group having 3 or more carbon atoms;

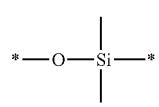

Partial structure (S)

* represents a bonding site to other atoms.

<8> The curable composition according to any one of <1> to <7>, in which a content of the curable compound (B) is in a range of 1% by mass to 50% by mass of all solid contents of the curable composition.

<9> The curable composition according to any one of <1> to <8>, further including: a curable compound (C) which is different from the curable compound (B).

<10> The curable composition according to any one of <1> to <9>, in which a maximum absorption wavelength of the near infrared-absorbing pigment (A) is in a range of 700 nm to 1000 nm.

<11> The curable composition according to any one of <1> to <10>, in which the near infrared-absorbing pigment (A) has a hydrophobic group.

<12> The curable composition according to any one of <1> to <11>, in which the near infrared-absorbing pigment (A) has a site having a C Log P of 5.3 or higher.

<13> The curable composition according to any one of <1> to <12>, in which the near infrared-absorbing pigment (A) has a hydrocarbon group having a C Log P of 5.3 or higher.

<14> The curable composition according to any one of <1> to <13>, in which the near infrared-absorbing pigment (A) is a pyrrolo-pyrrole pigment.

<15> The curable composition according to <14>, in which the pyrrolo-pyrrole pigment is a compound represented by the following formula;

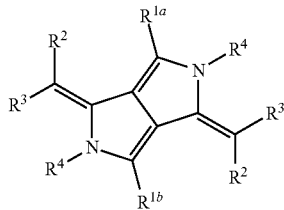

in the formula, each of $R^{1a}$ and $R^{1b}$ independently represents a substituent having an alkyl group, an aryl group, or a heteroaryl group; each of $R^2$ and $R^3$ independently represents a cyano group or a heterocyclic group; $R^4$ represents a hydrogen atom, an alkyl group, an aryl group, a heteroaryl group, substituted boron, or a metallic atom and may form a covalent bond or a coordination bond with at least one of $R^{1a}$, $R^{1b}$, and $R^3$.

<16> The curable composition according to any one of <1> to <15>, further including: at least one component selected from a polymerization initiator (D), a curing agent (E), and a solvent (F).

<17> The curable composition according to any one of <1> to <16>, in which the total amount of the solid contents in the curable composition is in a range of 5% by mass to 50% by mass.

<18> A cured film formed using the curable composition according to any one of <1> to <17>.

<19> A cured film including: a near infrared-absorbing pigment (A) and one or more atoms or groups selected from a fluorine atom, a silicon atom, a linear alkyl group having 8 or more carbon atoms, and a branched alkyl group having 3 or more carbon atoms, in which a concentration of the atoms or groups on one film surface of the cured film is higher than a concentration of the atoms or groups in the entire film.

<20> The cured film according to <19>, in which an average concentration of the near infrared-absorbing pigment (A) in the entire film is higher than a concentration of the near infrared-absorbing pigment (A) on the one film surface.

<21> A cured film including: a near infrared-absorbing pigment (A), in which an average concentration of the near infrared-absorbing pigment (A) in the entire film is higher than a concentration of the near infrared-absorbing pigment (A) on one film surface of the cured film.

<22> A cured film including: a near infrared-absorbing pigment (A), in which, when the cured film is immersed in a solvent for five minutes, a retention percentage of an absorbance of the near infrared-absorbing pigment (A) at a maximum absorption wavelength before and after immersion, which is represented by the following expression, is 95% or higher;

(the absorbance of the near infrared-absorbing pigment (A) at the maximum absorption wavelength after immersion/the absorbance of the near infrared-absorbing pigment (A) at the maximum absorption wavelength before immersion)×100.   expression <23> A method for manufacturing a cured film including: applying the curable composition according to any one of <1> to <17> in a lamellar shape, irradiating the curable composition with active radioactive rays, and/or heating the curable composition.

<24> A near infrared cut filter formed using the curable composition according to any one of <1> to <17>.

<25> A method for manufacturing a near infrared cut filter including: a step of applying the curable composition according to any one of <1> to <17> to a substrate in a lamellar shape and a step of forming a pattern image by exposing the lamellar curable composition through a mask and then developing the curable composition.

<26> A camera module including: a solid-state imaging element and the near infrared cut filter according to <24>.

<27> A method for manufacturing a camera module including a solid-state imaging element and a near infrared cut filter, including: a step of forming the near infrared cut filter by applying the curable composition according to any one of <1> to <17> on a light-receiving side of the solid-state imaging element.

According to the present invention, it has become possible to provide a curable composition which can be used to produce a cured film that does not easily allow a near infrared-absorbing pigment to be eluted even when the cured film is immersed in a solvent.

DESCRIPTION OF THE PREFERRED EMBODIMENTS

Figure 1:
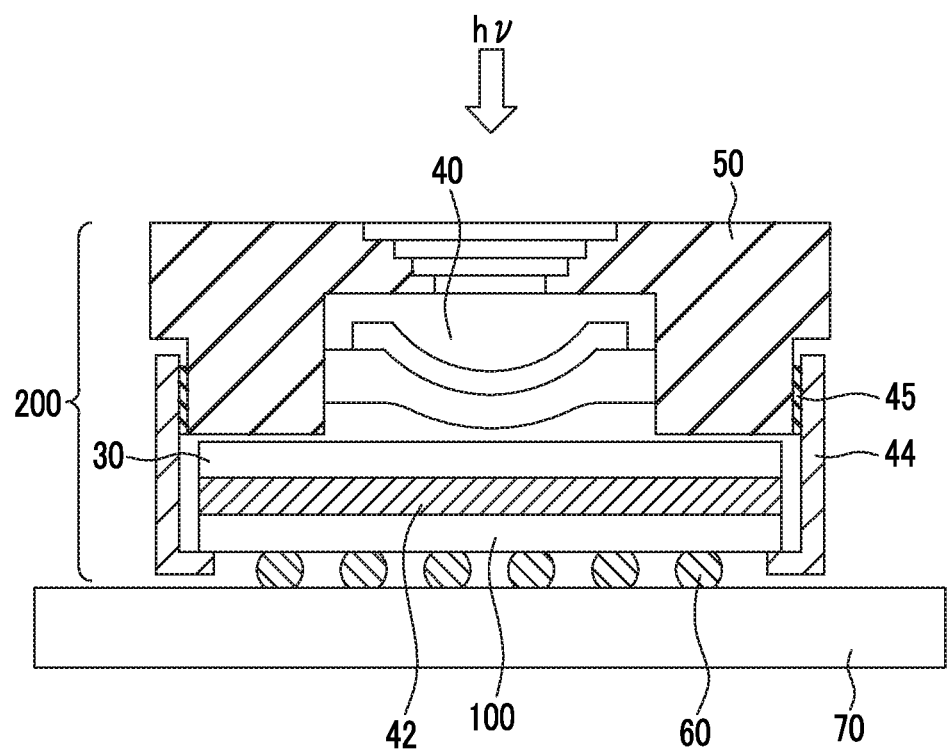
FIG. 1 is a schematic sectional view illustrating a constitution of a camera module including a solid-state imaging element according to an embodiment of the present invention.

Hereinafter, the contents of the present invention will be described in detail. Meanwhile, in the present specification, numerical ranges expressed using "to" refer to ranges including the numerical values before and after the "to" as the upper limit value and the lower limit value. In addition, in the present invention, an organic EL element refers to an organic electroluminescence element.

In the present specification, "(meth)acrylates" represent acrylates and methacrylates, "(meth)acrylic" represents acrylic and methacrylic, and "(meth)acryloyl" represents acryloyl and methacryloyl.

In addition, in the present specification, "monomers" and "monomers" refer to the same thing. Monomers in the present invention are classified into oligomers and polymers and refer to compounds having a weight-average molecular weight of 2,000 or less.

In the present specification, weight-average molecular weight and dispersity are defined as polystyrene-equivalent values obtained from the measurement through GPC. For example, in the present specification, the weight-average molecular weight (Mw) and the number-average molecular weight (Mn) of a curable compound (B) can be obtained using an HLC-8120 (manufactured by Tosoh Corporation), a TSK gel Multipore HXL-M (manufactured by Tosoh Corporation, 7.8 mm ID×30.0 cm) as a column, and tetrahydrofuran (THF) as an eluant.

In the present specification, polymerizing compounds refer to compounds having a polymerizable functional group and may be monomers or polymers. Polymerizable functional groups refer to groups that participate in polymerization reactions.

Regarding the denoting of a group (atomic group) in the present specification, a group not denoted using 'substituted' and 'unsubstituted' refers to both a group (atomic group) having no substituents and a group (atomic group) having a substituent.

A near infrared ray in the present invention refers to a light ray having a maximum absorption wavelength (λmax) in a range of 700 nm to 1000 nm.

<Curable Composition>

A curable composition of the present invention (hereinafter, also referred to as "the composition of the present invention") includes a near infrared-absorbing pigment (A) and a curable compound (B) having one or more atoms or groups selected from a fluorine atom, a silicon atom, a linear alkyl group having 8 or more carbon atoms, and a branched alkyl group having 3 or more carbon atoms or a curable compound (B) having a hydrophobic group. According to the present invention, it is possible to provide a curable composition which can be used to produce a cured film that does not easily allow a near infrared-absorbing pigment to be eluted even when the cured film is immersed in a solvent.

The mechanism therefor is not clear but is considered as below. When the curable compound (B) having one or more atoms or groups selected from a fluorine atom, a silicon atom, a linear alkyl group having 8 or more carbon atoms, and a branched alkyl group having 3 or more carbon atoms or the curable compound (B) having a hydrophobic group is formulated into a curable composition, and the curable composition is applied onto a substrate in a lamellar shape, there is a tendency that the curable compound (B) is unevenly located in a surface-side section far from the substrate. When the composition of the present invention is cured in a state in which the curable compound (B) is unevenly located as described above, a region in which the proportion of a cured substance of the curable compound (B) is high is formed on a surface far from the substrate. The presence of the above-described region can suppress leakage of the near infrared-absorbing pigment (A) from a film surface even when a cured film is immersed in a solvent.

<<Near Infrared-Absorbing Pigment (A)>>

The near infrared-absorbing pigment (A) used in the present invention is preferably a substance having a maximum absorption wavelength region preferably in a range of 700 nm to 1000 nm and more preferably in a range of 800 nm to 900 nm. The number of near infrared-absorbing substances included in the curable composition may be one or more.

The molar light absorption coefficients of the near infrared-absorbing pigment is not particularly limited, but is preferably in a range of 50,000 to 500,000 and more preferably in a range of 100,000 to 300,000.

In the present invention, it is also possible to use a near infrared-absorbing pigment having a hydrophobic group. Even in a case in which a near infrared-absorbing pigment having a hydrophobic group is used, when the curable compound (B) is formulated into the composition of the present invention, the curable compound (B) is unevenly located in a surface-side section far from the substrate, and a region in which the proportion of a cured substance of the curable compound (B) is high is formed on a surface far from the substrate, and thus it is possible to suppress leakage of the near infrared-absorbing pigment from a film surface even when a cured film for which the near infrared-absorbing pigment having a hydrophobic group is used is immersed in a solvent.

In addition, in a case in which an uneven pigment is used as the near infrared-absorbing pigment, the effect of the present invention is more effectively exhibited.

The near infrared-absorbing pigment preferably has, as a hydrophobic group, a site having a C Log P value of 5.3 or higher (hereinafter, referred to as substituent R) and more preferably has the substituent R at a terminal portion in a molecule.

In the present specification, the C Log P value refers to a value calculated by substituting a substituent site with a hydrogen atom using Chem. Draw software (Version 2.0).

While the mother nucleus of an infrared-absorbing pigment also has an influence, in a case in which the near infrared-absorbing pigment has a substituent having a high C Log P value, there is a tendency that the near infrared-absorbing pigment is easily unevenly located on the surface of a film to be formed. Therefore, in the present invention, the curable compound (B) that is easily unevenly located in a surface section is jointly used with the near infrared-absorbing pigment, and thus the near infrared-absorbing pigment can be more uniformly dispersed in a film.

The C Log P value of the substituent R is preferably 6 or higher, more preferably 9 or higher, and still more preferably 10 or higher. The upper limit of the C Log P value of the substituent R is not particularly limited, but is preferably 20 or lower. When the C Log P value of the substituent R is set to 20 or lower, there is a tendency that the solubility in a solvent is improved, and, when a composition including the near infrared-absorbing pigment is prepared in a liquid form, the solubility of the near infrared-absorbing pigment in a solvent can be enhanced.

The substituent R preferably has a hydrocarbon group and more preferably has an alkyl group. The alkyl group preferably has a linear shape or a branched shape and more preferably has a branched shape. The number of carbon atoms in the alkyl group is preferably 3 or more, more preferably 8 or more, still more preferably 16 or more, and particularly preferably 20 or more. The upper limit of the number of carbon atoms in the alkyl group is not particularly limited, but is preferably 30 or less and more preferably 25 or less.

The near infrared-absorbing pigment preferably has one or more substituents R and more preferably has two or more substituents. The upper limit of the number of the substituents R is not particularly limited, but is preferably 4 or less and more preferably 3 or less.

The near infrared-absorbing pigment may have only one substituent R or may have two or more substituents.

Examples of the substituent R having a C Log P value in the above-described range will be described below, but the substituent is not limited thereto.

Examples of the near infrared-absorbing pigment include pyrrolo-pyrrole pigments, copper compounds, cyanine-based pigments, phthalocyanine-based compounds, immonium-based compounds, thiol complex-based compounds, transition metal oxide-based compounds, squarylium-based pigments, naphthalocyanine-based pigments, quaterrylene-based pigments, dithiol metal complex-based pigments, croconium compounds, and the like.

The near infrared-absorbing pigment used in the present invention is preferably a pyrrolo-pyrrole pigment and more preferably a compound represented by Formula (A1) below.

TABLE 1

| Substituent R | CLogP value |
|---|---|
| R1 | 5.455 |
| R2 | 5.984 |
| R3 | 6.513 |
| R4 | 7.042 |
| R5 | 7.571 |
| R6 | 8.1 |
| R7 | 8.629 |
| R8 | 9.158 |
| R9 | 9.687 |
| R10 | 10.216 |
| R11 | 10.745 |
| R12 | 11.274 |
| R13 | 11.144 |
| R14 | 9.028 |
| R15 | 11.982 |

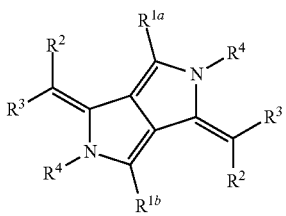

Formula (A1)

In Formula (A1), each of $R^{1a}$ and $R^{1b}$ independently represents a substituent having an alkyl group, an aryl group, or a heteroaryl group. Each of $R^2$ and $R^3$ independently represents a hydrogen atom or a substituent, at least one of $R^2$ and $R^3$ is an electron-withdrawing group, and $R^2$ and $R^3$ may bond to each other and thus form a ring. $R^4$ represents a hydrogen atom, an alkyl group, an aryl group, a heteroaryl group, substituted boron, or a metallic atom and may form a covalent bond or a coordination bond with at least one of $R^{1a}$, $R^{1b}$, and $R^3$.

In Formula (A1), the number of carbon atoms in the alkyl group included in the substituent represented by $R^{1a}$ or $R^{1b}$ is preferably 1 or more, more preferably 3 or more, still more preferably 8 or more, and particularly preferably 16 or more. The upper limit of the number of carbon atoms in the alkyl group is preferably 30 or less, more preferably 25 or less, can be set to 20 or less, and furthermore, can also be set to 10 or less.

The number of carbon atoms in the aryl group included in the substituent represented by $R^{1a}$ or $R^{1b}$ is preferably in a range of 6 to 30, more preferably in a range of 6 to 20, and still more preferably in a range of 6 to 12.

The number of carbon atoms in the heteroaryl group included in the substituent represented by $R^{1a}$ or $R^{1b}$ is preferably in a range of 6 to 30 and more preferably in a range of 6 to 12. Examples of the heteroatom include a nitrogen atom, an oxygen atom, and a sulfur atom.

The preferred range of the C Log P value of the alkyl group, the aryl group, or the heteroaryl group included in $R^{1a}$ or $R^{1b}$ is identical to that of the above-described substituent R.

Particularly, the substituent represented by $R^{1a}$ or $R^{1b}$ is preferably an aryl group having an alkoxy group having a branched alkyl group. The number of carbon atoms in the alkyl group in the branched alkyl group is preferably 3 or more, more preferably 8 or more, and still more preferably 16 or more. The upper limit of the number of carbon atoms in the branched alkyl group is 30 or less, more preferably 25 or less, and can also be set to 20 or less.

The substituent represented by $R^{1a}$ or $R^{1b}$ is particularly preferably, for example, 4-(2-ethylhexyloxy)phenyl, 4-(2-methylbutyloxy)phenyl, or 4-(2-octyldodecyloxy)phenyl.

$R^{1a}$ and $R^{1b}$ in General Formula (A-1) may be identical to or different from each other.

Each of $R^2$ and $R^3$ independently represents a hydrogen atom or a substituent T, at least one of $R^2$ and $R^3$ is an electron-withdrawing group, and $R^2$ and $R^3$ may bond to each other and thus form a ring. Particularly, each of $R^2$ and $R^3$ independently preferably represents a cyano group or a heterocyclic group.

Examples of the substituent T will be described below.

An alkyl group (preferably having 1 to 30 carbon atoms), an alkenyl group (preferably having 2 to 30 carbon atoms), an alkynyl group (preferably having 2 to 30 carbon atoms), an aryl group (preferably having 6 to 30 carbon atoms), an amino group (preferably having 0 to 30 carbon atoms), an alkoxy group (preferably having 1 to 30 carbon atoms), an aryloxy group (preferably having 6 to 30 carbon atoms), an aromatic heterocyclic oxy group (preferably having 1 to 30 carbon atoms), an acyl group (preferably having 1 to 30 carbon atoms), an alkoxycarbonyl group (preferably having 2 to 30 carbon atoms), an aryloxycarbonyl group (preferably having 7 to 30 carbon atoms), an acyloxy group (preferably having 2 to 30 carbon atoms), an acylamino group (preferably having 2 to 30 carbon atoms), an alkoxycarbonylamino group (preferably having 2 to 30 carbon atoms), an aryloxy carbonyl amino group (preferably having 7 to 30 carbon atoms), a sulfonylamino group (preferably having 1 to 30 carbon atoms), a sulfamoyl group (preferably having 0 to 30 carbon atoms), a carbamoyl group (preferably having 1 to 30 carbon atoms), an alkylthio group (preferably having 1 to 30 carbon atoms), an arylthio group (preferably having 6 to 30 carbon atoms), an aromatic heterocyclic thio group (preferably having 1 to 30 carbon atoms), a sulfonyl group (preferably having 1 to 30 carbon atoms), a sulfinyl group (preferably having 1 to 30 carbon atoms), a ureido group (preferably having 1 to 30 carbon atoms), an amide phosphate group (preferably having 1 to 30 carbon atoms), a hydroxy group, a mercapto group, a halogen atom, a cyano group, a sulfo group, a carboxyl group, a nitro group, a hydroxamic group, a sulfino group, a hydrazino group, an imino group, and a heterocyclic group (preferably having 1 to 30 carbon atoms).

At least one of $R^2$ and $R^3$ is an electron-withdrawing group. A substituent having a positive Hammett σp value (sigma para value) generally acts as an electron-withdrawing group. The electron-withdrawing group is preferably a cyano group, an acyl group, an alkyloxycarbonyl group, an aryloxycarbonyl group, a sulfamoyl group, a sulfinyl group, or a heterocyclic group, and more preferably a cyano group. These electron-withdrawing groups may have another substituent.

In the present invention, a substituent having a Hammett substituent constant σp value of 0.2 or higher can be exemplified as the electron-withdrawing group. The σp value is preferably 0.25 or higher, more preferably 0.3 or higher, and particularly preferably 0.35 or higher. The upper limit thereof is not particularly limited, but is preferably 0.80.

Specific examples thereof include a cyano group (0.66), a carboxyl group (—COOH: 0.45), an alkoxycarbonyl group (—COOMe: 0.45), an aryloxycarbonyl group (—COOPh: 0.44), a carbamoyl group (—CONH$_2$: 0.36), an alkylcarbonyl group (—COMe: 0.50), an arylcarbonyl group (—COPh: 0.43), an alkylsulfonyl group (—SO$_2$Me: 0.72), an arylsulfonyl group (—SO$_2$Ph: 0.68), and the like. The electron-withdrawing group is particularly preferably a cyano group. Here, Me represents a methyl group and Ph represents a phenyl group.

Regarding the Hammett substituent constant σp value, for example, Paragraphs "0017" and "0018" of JP2011-68731A can be referred to, and the content thereof is incorporated into the present specification.

Furthermore, in a case in which $R^2$ and $R^3$ bond to each other and thus form a ring, a 5- to 7-membered ring (preferably a 5- or 6-membered ring) is preferably formed. The ring to be formed is preferably a ring which is generally used as an acidic nucleus in a merocyanine pigment, and regarding specific examples thereof, for example, Paragraphs "0019" to "0021" of JP2011-68731A can be referred to, and the content thereof is incorporated into the present specification.

$R^3$ is particularly preferably a heterocyclic ring. Particularly, $R^3$ is preferably quinoline, benzothiazole, or naphthothiazole.

Two $R^2$'s in Formula (A1) may be identical to or different from each other, and two $R^3$'s may be identical to or different from each other.

When the group represented by $R^4$ is an alkyl group, an aryl group, or a heteroaryl group, the group is identical to that described in the section of $R^{1a}$ and $R^{1b}$, and a preferred group is also identical.

When the group represented by $R^4$ is substituted boron, a substituent therefor is identical to the substituent T described in the section of $R^2$ and $R^3$, and is preferably an alkyl group, an aryl group, or a heteroaryl group.

In addition, when the group represented by $R^4$ is a metal atom, the group is preferably a transition metal and particularly preferably substituted boron. The substituted boron is preferably difluoroboron, diphenylboron, dibutylboron, dinaphthylboron, or catechol boron. Among these, diphenylboron is particularly preferred.

$R^4$ may form a covalent bond or a coordination bond with at least one of $R^{1a}$, $R^{1b}$, and $R^3$, and $R^4$ particularly preferably forms a coordination bond with $R^3$.

Particularly, $R^4$ is preferably a hydrogen atom or substituted boron (particularly diphenylboron).

Two $R^4$'s in Formula (A1) may be identical to or different from each other.

Regarding the compound represented by Formula (A1), for example, Paragraphs "0024" to "0052" of JP2011-68731A (Paragraph "0043" to "0074" in the specification of the corresponding US2011/0070407A) can be referred to, and the content thereof is incorporated into the present specification.

The near infrared-absorbing pigment is more preferably a compound represented by Formula (A2) below and still more preferably a compound represented by Formula (A3).

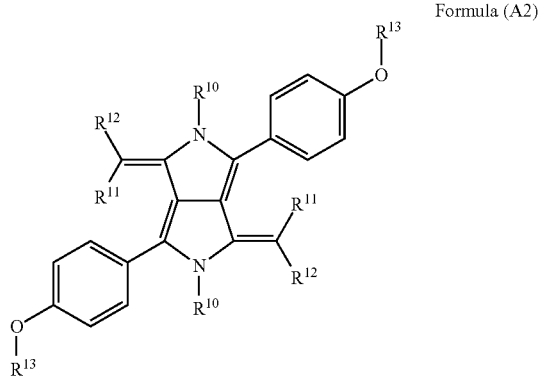

Formula (A2)

In Formula (A2), each of $R^{10}$'s independently represents a hydrogen atom, an alkyl group, an aryl group, a heteroaryl group, substituted boron, or a metal atom and may form a covalent bond or a coordination bond with $R^{12}$. Each of $R^{11}$ and $R^{12}$ independently represents a hydrogen atom or a substituent, at least one of $R^{11}$ and $R^{12}$ is an electron-withdrawing group, and $R^{11}$ and $R^{12}$ may bond to each other and thus form a ring. Each of $R^{13}$'s independently represents a branched alkyl group having 3 to 30 carbon atoms.

$R^{10}$ is identical to $R^4$ in Formula (A1), and the preferred range thereof is also identical.

$R^{11}$ and $R^{12}$ are identical to $R^2$ and $R^3$ in Formula (A1), and the preferred ranges thereof are also identical.

$R^{13}$'s may be identical to or different from each other. The number of carbon atoms in $R^{13}$ is identical to that in the branched alkyl group described in the section of $R^{1a}$ and $R^{1b}$ in Formula (A1), and the preferred range thereof is also identical. The preferred range of the C Log P value of $R^{13}$ is identical to that of the above-described substituent R.

In addition, $R^{13}$ is preferably, for example, an alcohol residue derived from isoeicosanol (manufactured by Nissan Chemical Industries, Ltd., FINEOXOCOL 2000).

The alcohol may have a linear shape or a branched shape and is preferably an alcohol having 1 to 30 carbon atoms, more preferably an alcohol having 3 to 25 carbon atoms, and particularly preferably a branched alcohol having 3 to 25 carbon atoms. More specific examples thereof include methanol, ethanol, iso-propanol, n-butanol, tert-butanol, 1-octanol, 1-decanol, 1-hexadecanol, 2-methylbutanol, 2-ethylhexanol, 2-octyldodecanol, isohexadecanol (manufactured by Nissan Chemical Industries, Ltd., FINEOXOCOL 1600), isooctadecanol (manufactured by Nissan Chemical Industries, Ltd., FINEOXOCOL 180), isooctadecanol (manufactured by Nissan Chemical Industries, Ltd., FINEOXOCOL 180N), isooctadecanol (manufactured by Nissan Chemical Industries, Ltd., FINEOXOCOL 180T), isoeicosanol (manufactured by Nissan Chemical Industries, Ltd., FINEOXOCOL 2000), and the like. These alcohols may be mixtures of two or more alcohols.

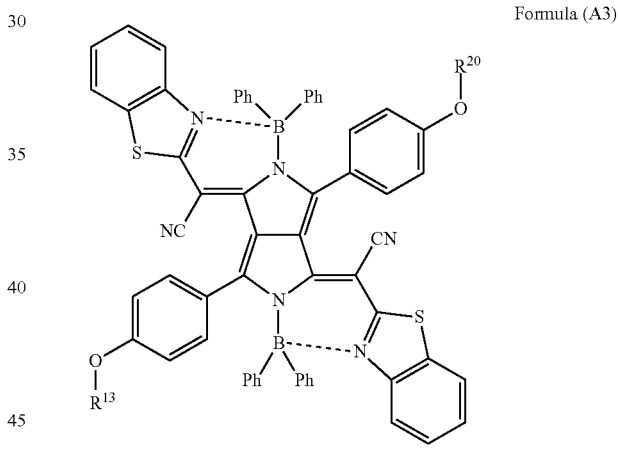

Formula (A3)

In Formula (A3), each of $R^{20}$'s independently represents a branched alkyl group having 3 to 30 carbon atoms.

In Formula (A3), $R^{20}$ is identical to $R^{13}$ in Formula (A2), and the preferred range thereof is also identical.

In the present invention, as the near infrared-absorbing pigment (A), a copper compound is also preferred.

In a case in which the copper compound is a copper complex, a ligand L which coordinates copper is not particularly limited as long as the ligand is capable of forming a covalent bond with a copper ion, and examples thereof include compounds having sulfonic acid, carboxylic acid, phosphoric acid, a phosphoric acid ester, phosphonic acid, a phosphonic acid ester, phosphinic acid, substituted phosphinic acid, a carbonyl (ester, ketone), an amine, an amide, a sulfonamide, urethane, urea, an alcohol, or a thiol. Among these, a compound having carboxylic acid and sulfonic acid are preferred, and a compound having sulfonic acid is more preferred.

Specific examples of the copper complex include phosphorus-containing copper compounds, copper sulfonate compounds, and copper compounds represented by the following formula. Regarding the phosphorus-containing copper compounds, specifically, for example, the compounds described in Row 27 on Page 5 to Row 20 on Page 7 in WO2005/030898A can be referred to, and the contents thereof is incorporated into the present specification.

Examples of the copper complex include copper complexes represented by Formula (A4) below.

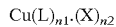    Formula (A4)

In Formula (A4), L represents a ligand coordinating copper, X is not present or represents a halogen atom, $H_2O$, $NO_3$, $ClO_4$, $SO_4$, $CN$, $SCN$, $BF_4$, $PF_6$, $BPh_4$ (Ph represents a phenyl group), or an alcohol. Each of n1 and n2 independently represents an integer from 1 to 4.

The ligand L has a substituent including C, N, O, or S as an atom capable of coordinating copper and more preferably has a group having a lone electron pair such as N, O, or S. The number of kinds of the group capable of coordinating copper in the molecule is not limited to one and may be two or more, and the group may or may not be dissociated. A preferred ligand L is identical to the above-described ligand L. In a case in which the group is dissociated, X is not present.

The copper complex has a form in which a copper central metal is coordinated with the ligand. Copper in the copper complex is generally divalent copper, and the copper complex can be obtained by, for example, mixing and reacting a compound or a salt thereof, which serves as the ligand, with a copper component.

The compound which serves as the ligand is preferably a compound having a coordination site and is preferably a compound represented by General Formula (A5) below.

    General Formula (A5)

In General Formula (A5), $X^1$ represents a coordination site, n3 represents an integer from 1 to 6, and $R^1$ represents a single bond or an n-valent group.

In General Formula (A5), $X^1$ is preferably a coordination site to be coordinated with an anion or a coordination site to be coordinated with an unshared electron pair. The anion needs to be capable of coordinating a copper atom among copper components and is preferably an oxygen anion, a nitrogen anion, or a sulfur anion.

The coordination site to be coordinated with an anion is preferably at least one coordination site selected from Group (AN) below.

Group (AN)

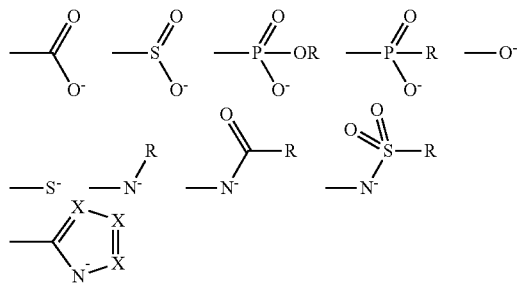

In Group (AN), X represents N or CR, and each of R's independently represents a hydrogen atom, an alkyl group, an alkenyl group, an alkynyl group, an aryl group, or a heteroaryl group.

The alkyl group may have a linear shape, a branched shape, or a cyclic shape, but preferably has a linear shape. The number of carbon atoms in the alkyl group is preferably in a range of 1 to 10, more preferably in a range of 1 to 6, and still more preferably in a range of 1 to 4. Examples of the alkyl group include a methyl group. The alkyl group may have a substituent, and examples of the substituent include a halogen atom, a carboxyl group, and a heterocyclic group. The heterocyclic group as the substituent may be a monocyclic ring or a polycyclic ring and may be an aromatic group or a non-aromatic group. The number of hetero atoms constituting the heterocyclic ring is preferably in a range of 1 to 3 and more preferably 1 or 2. The hetero atom constituting the heterocyclic ring is preferably a nitrogen atom. In a case in which the alkyl group has a substituent, the alkyl group may have another substituent.

The number of carbon atoms in the alkenyl group is preferably in a range of 1 to 10 and more preferably in a range of 1 to 6.

The number of carbon atoms in the alkynyl group is preferably in a range of 1 to 10 and more preferably in a range of 1 to 6.

The aryl group may be a monocyclic ring or a polycyclic ring, but is preferably a monocyclic ring. The number of carbon atoms in the aryl group is preferably in a range of 6 to 18, more preferably in a range of 6 to 12, and still more preferably 6.

The heteroaryl group may be a monocyclic ring or a polycyclic ring. The number of hetero atoms constituting the heteroaryl group is preferably in a range of 1 to 3. The hetero atom constituting the heteroaryl group is preferably a nitrogen atom, a sulfur atom, or an oxygen atom. The number of carbon atoms in the heteroaryl group is preferably in a range of 6 to 18 and more preferably in a range of 6 to 12.

Examples of the coordination site to be coordinated with an anion also include a monoanionic coordination site. The monoanionic coordination site refers to a site at which a copper atom is coordinated through a functional group having one negative charge. Examples of the functional group include acid groups having a phosphorus atom (a phosphoric acid diester group, a phosphonic acid monoester group, a phosphinic acid group, and the like), a sulfo group, a carboxyl group, a hydroxyl group, and the like.

As a coordinating atom to be coordinated with an unshared electron pair, the coordination site to be coordinated with an unshared electron pair preferably includes an oxygen atom, a nitrogen atom, a sulfur atom, or a phosphorus atom, more preferably includes an oxygen atom, a nitrogen atom, or a sulfur atom, and still more preferably a nitrogen atom.

The coordination site to be coordinated with an unshared electron pair is preferably a ring including a coordinating atom to be coordinated with an unshared electron pair or a partial structure selected from Group (UE) below.

The ring including a coordinating atom to be coordinated with an unshared electron pair may be a monocyclic ring or a polycyclic ring and may be aromatic or non-aromatic.

The ring including a coordinating atom to be coordinated with an unshared electron pair may have a substituent, and examples of the substituent include an alkyl group, an aryl group, a halogen atom, a silicon atom, an alkoxy group, an acyl group, an alkylthio group, a carboxyl group, and the like. In a case in which the ring including a coordinating atom to be coordinated with an unshared electron pair has a substituent, the ring may have another substituent.

Group (UE)

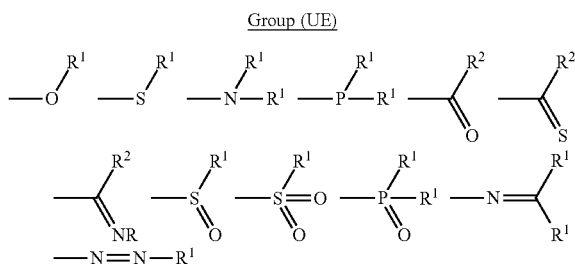

In Group (UE), each of R and $R^1$ independently represents a hydrogen atom, an alkyl group, an alkenyl group, an alkynyl group, an aryl group, or a heteroaryl group, and each of $R^2$'s independently represents a hydrogen atom, an alkyl group, an alkenyl group, an alkynyl group, an aryl group, a heteroaryl group, an alkoxy group, an aryloxy group, a heteroaryloxy group, an alkylthio group, an arylthio group, a heteroarylthio group, an amino group, or an acyl group.

The alkyl group represented by R, $R^1$, or $R^2$ in Group (UE) is identical to the alkyl group described in the section of Group (AN), and the preferred range thereof is also identical.

The alkenyl group represented by R, $R^1$, or $R^2$ in Group (UE) is identical to the alkenyl group described in the section of Group (AN), and the preferred range thereof is also identical.

The alkynyl group represented by R, $R^1$, or $R^2$ in Group (UE) is identical to the alkynyl group described in the section of Group (AN), and the preferred range thereof is also identical.

The aryl group represented by R, $R^1$, or $R^2$ in Group (UE) is identical to the aryl group described in the section of Group (AN), and the preferred range thereof is also identical.

The heteroaryl group represented by R, or $R^2$ in Group (UE) is identical to the heteroaryl group described in the section of Group (AN), and the preferred range thereof is also identical.

The number of carbon atoms in the alkoxy group represented by $R^2$ in Group (UE) is preferably in a range of 1 to 12 and more preferably in a range of 3 to 9.

The number of carbon atoms in the aryloxy group represented by $R^2$ in Group (UE) is preferably in a range of 6 to 18 and more preferably in a range of 6 to 12.

The heteroaryloxy group represented by $R^2$ in Group (UE) may be a monocyclic ring or a polycyclic ring. The heteroaryl group constituting the heteroaryloxy group is identical to the heteroaryl group described in the section of Group (AN), and the preferred range thereof is also identical.

The number of carbon atoms in the alkylthio group represented by $R^2$ in Group (UE) is preferably in a range of 1 to 12 and more preferably in a range of 1 to 9.

The number of carbon atoms in the arylthio group represented by $R^2$ in Group (UE) is preferably in a range of 6 to 18 and more preferably in a range of 6 to 12.

The heteroarylthio group represented by $R^2$ in Group (UE) may be a monocyclic ring or a polycyclic ring. The heteroaryl group constituting the heteroarylthio group is identical to the heteroaryl group described in the section of Group (AN), and the preferred range thereof is also identical.

The number of carbon atoms in the acyl group represented by $R^2$ in Group (UE) is preferably in a range of 2 to 12 and more preferably in a range of 2 to 9.

$X^1$ may be an acid group and is preferably at least one acid group selected from acid groups having a sulfonic acid group, a carboxylic acid group, and a phosphorus atom. The number of $X^1$'s may be one or more, but is preferably two or more. $X^1$ preferably has a sulfonic acid group and a carboxylic acid group.

In General Formula (A5), n3 is preferably in a range of 1 to 3, more preferably 2 or 3, and still more preferably 3.

In General Formula (A5), the n-valent group is preferably an n-valent organic group or a group formed of a combination of an n-valent organic group and, —O—, —SO—, —$SO_2$—, —$NR^{N1}$—, —CO—, or —CS—. Examples of the n-valent organic group include a hydrocarbon group, an oxyalkylene group, a heterocyclic group, and the like. In addition, the n-valent group may be a group including at least one partial structure selected from Group (AN-1), a ring including a coordinating atom to be coordinated with an unshared electron pair, or a group including at least one partial structure selected from Group (UE-1).

The hydrocarbon group is preferably an aliphatic hydrocarbon group or an aromatic hydrocarbon group. The hydrocarbon group may have a substituent, and examples of the substituent include an alkyl group, a halogen atom (preferably a fluorine atom), a polymerizable group (for example, a vinyl group, a (meth)acryloyl group, an epoxy group, an oxetane group, or the like), a sulfonic acid group, a carboxylic acid group, an acid group having a phosphorus atom, a carboxylic acid ester group (for example, —$CO_2CH_3$), a hydroxyl group, an alkoxy group (for example, a methoxy group), an amino group, a carbamoyl group, a carbamoyloxy group, a halogenated alkyl group (for example, a fluoroalkyl group or a chloroalkyl group), a (meth)acryloyl group, and the like. In a case in which the hydrocarbon group has a substituent, the hydrocarbon group may have another substituent, and examples of the substituent include an alkyl group, the above-described polymerizable group, a halogen atom, and the like.

In a case in which the hydrocarbon group is monovalent, an alkyl group, an alkenyl group, or an aryl group is preferred, and an aryl group is more preferred. In addition, in a case in which the hydrocarbon group is divalent, the hydrocarbon group is preferably an alkylene group, an arylene group, or an oxyalkylene group, and more preferably an arylene group. In a case in which the hydrocarbon group is trivalent, a group corresponding to the monovalent hydrocarbon group or the divalent hydrocarbon group is preferred.

The alkyl group and the alkylene group may have any of a linear shape, a branched shape, and a cyclic shape. The number of carbon atoms in the linear alkyl group and alkylene group is preferably in a range of 1 to 20, more preferably in a range of 1 to 12, and still more preferably in a range of 1 to 8. The number of carbon atoms in the branched alkyl group and alkylene group is preferably in a range of 3 to 20, more preferably in a range of 3 to 12, and still more preferably in a range of 3 to 8. The cyclic alkyl group and alkylene group may be either monocyclic rings or polycyclic rings. The number of carbon atoms in the cyclic alkyl group and alkylene group is preferably in a range of 3 to 20, more preferably in a range of 4 to 10, and still more preferably in a range of 6 to 10.

The number of carbon atoms in the alkenyl or alkenylene group is preferably in a range of 2 to 10, more preferably in a range of 2 to 8, and still more preferably in a range of 2 to 4.

The number of carbon atoms in the aryl or arylene group is preferably in a range of 6 to 18, more preferably in a range of 6 to 14, and still more preferably in a range of 6 to 10.

Examples of the heterocyclic group include heterocyclic groups having a hetero atom in an alicyclic group and aromatic heterocyclic groups. The heterocyclic group is preferably a 5- or 6-membered ring. In addition, the heterocyclic group is a monocyclic ring or a fused ring, preferably a monocyclic ring or a fused ring having 2 to 8 fused portions, and more preferably a monocyclic ring or a fused ring having 2 to 4 fused portions. The heterocyclic ring group may have a substituent, and the substituent is identical to the above-described substituent that the hydrocarbon group may have.

In $-NR^{N1}-$, $R^{N1}$ represents a hydrogen atom, an alkyl group, an aryl group, or an aralkyl group. The alkyl group as $R^{N1}$ may have any of a chain shape, a branched shape, and a cyclic shape. The number of carbon atoms in the linear or branched alkyl group is preferably in a range of 1 to 20 and more preferably in a range of 1 to 12. The cyclic alkyl group may be either a monocyclic ring or a polycyclic ring. The number of carbon atoms in the cyclic alkyl group is preferably in a range of 3 to 20 and more preferably in a range of 4 to 14. The number of carbon atoms in the aryl group as $R^{N1}$ is preferably in a range of 6 to 18 and more preferably in a range of 6 to 14. Specific examples thereof include a phenyl group, a naphthyl group, and the like. The aralkyl group as $R^{N1}$ is preferably an aralkyl group having 7 to 20 carbon atoms and more preferably an unsubstituted aralkyl group having 7 to 15 carbon atoms.

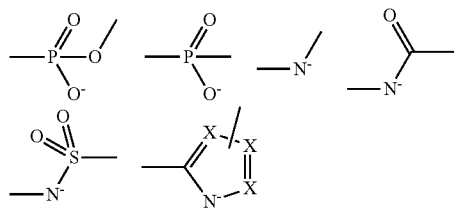

In Group (AN-1), X represents N or CR, and each of R's independently represents a hydrogen atom, an alkyl group, an alkenyl group, an alkynyl group, an aryl group, or a heteroaryl group. X is identical to X in Group (AN) described above, and a preferred range thereof is also identical.

Group (UE-1)

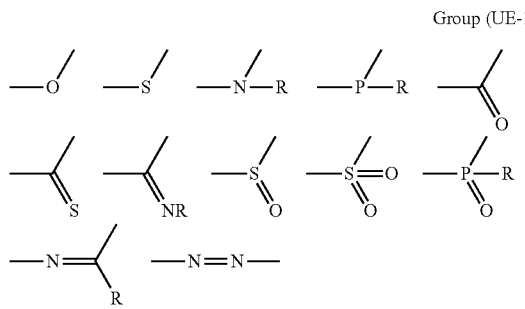

In Group (UE-1), each of R's independently represents a hydrogen atom, an alkyl group, an alkenyl group, an alkynyl group, an aryl group, or a heteroaryl group, is identical to R in Group (UE), and a preferred range thereof is also identical.

The compound or a salt thereof which serves as the ligand is not particularly limited, is also preferably a compound having an acid group or a salt thereof, and examples thereof preferably include organic acid compounds (for example, a sulfonic acid compound, a carboxylic acid compound, and a phosphoric acid compound) and salts thereof.

The molecular weight of the compound or a salt thereof which serves as the ligand is preferably 80 or higher, and the upper limit value thereof is preferably 1000 or lower, more preferably 750 or lower, and still more preferably 600 or lower.

Sulfonic Acid Copper Complex

In a sulfonic acid copper complex, copper is used as a central metal, and a sulfonic acid compound is used as a ligand. The sulfonic acid compound is preferably a compound represented by General Formula (A6) below.

General Formula (A6)

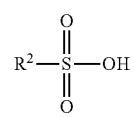

In General Formula (A6), $R^2$ represents a monovalent organic group.

The compound represented by General Formula (A6) or a salt thereof acts as a ligand coordinating copper.

Examples of the specific monovalent organic group as $R^2$ in General Formula (A6) include a hydrocarbon group, and specific examples thereof include linear, branched, or cyclic alkyl groups, alkenyl groups, and aryl groups. Here, these groups may be groups through a divalent linking group (for example, a linear or branched alkylene group, a cyclic alkylene group (cycloalkylene group), an arylene group, $-O-$, $-S-$, $-CO-$, $-C(=O)O-$, $-SO_2-$, $-NR-$ (R represents a hydrogen atom or an alkyl group), or the like).

The number of carbon atoms in the linear alkyl group, the branched alkyl group, the cyclic alkyl group, the alkenyl group, or the aryl group is identical to that described in the section of $R^1$ in General Formula (A5), and the preferred range thereof is also identical.

In addition, the monovalent organic group may have a substituent. Examples of the substituent that the monovalent organic group may have include an alkyl group, a polymerizable group (for example, a vinyl group, a (meth)acryloyl group, an epoxy group, an oxetane group, or the like), a halogen atom, a carboxyl group, a carboxylic acid ester group (for example, $-CO_2CH_3$), a hydroxyl group, an amide group, a halogenated alkyl group (for example, a fluoroalkyl group or a chloroalkyl group), and the like.

Examples of the linear or branched alkylene group, the cyclic alkylene group, and the arylene group which are divalent linking groups include divalent linking groups derived by removing one hydrogen atom from the above-described linear, branched, or cyclic alkyl groups or aryl groups.

The molecular weight of the compound represented by General Formula (A6) is preferably in a range of 80 to 750, more preferably in a range of 80 to 600, and still more preferably in a range of 80 to 450.

Specific examples of the compound represented by General Formula (A6) will be illustrated below, but the compound is not limited thereto.

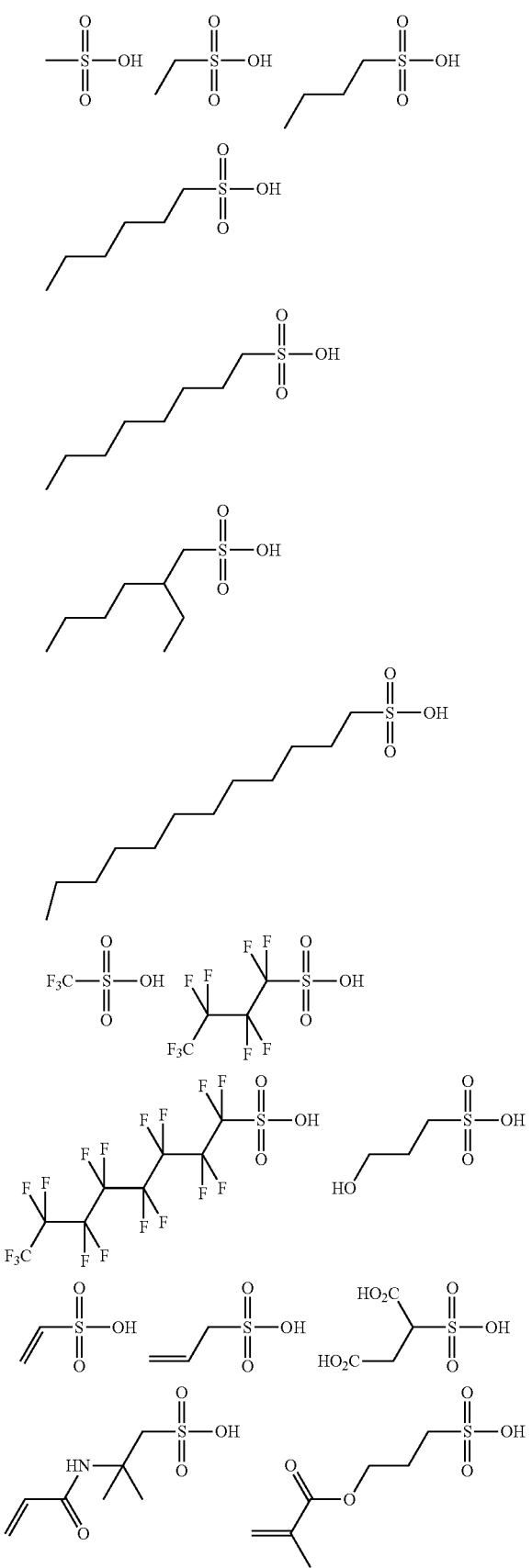
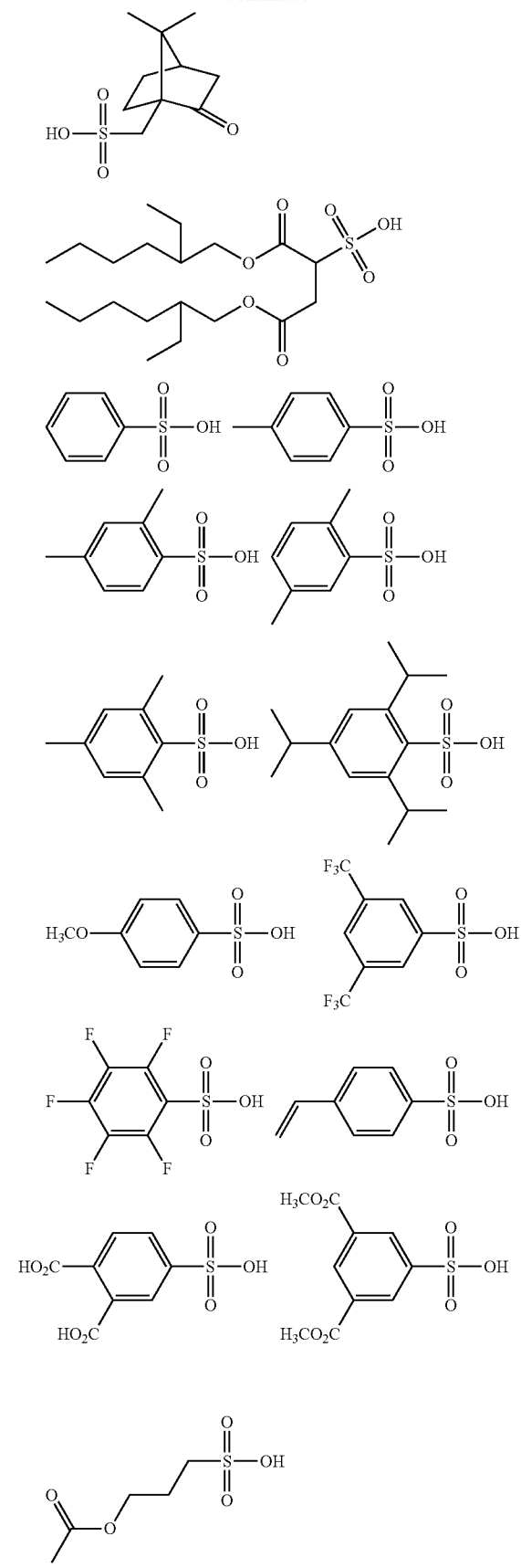

-continued

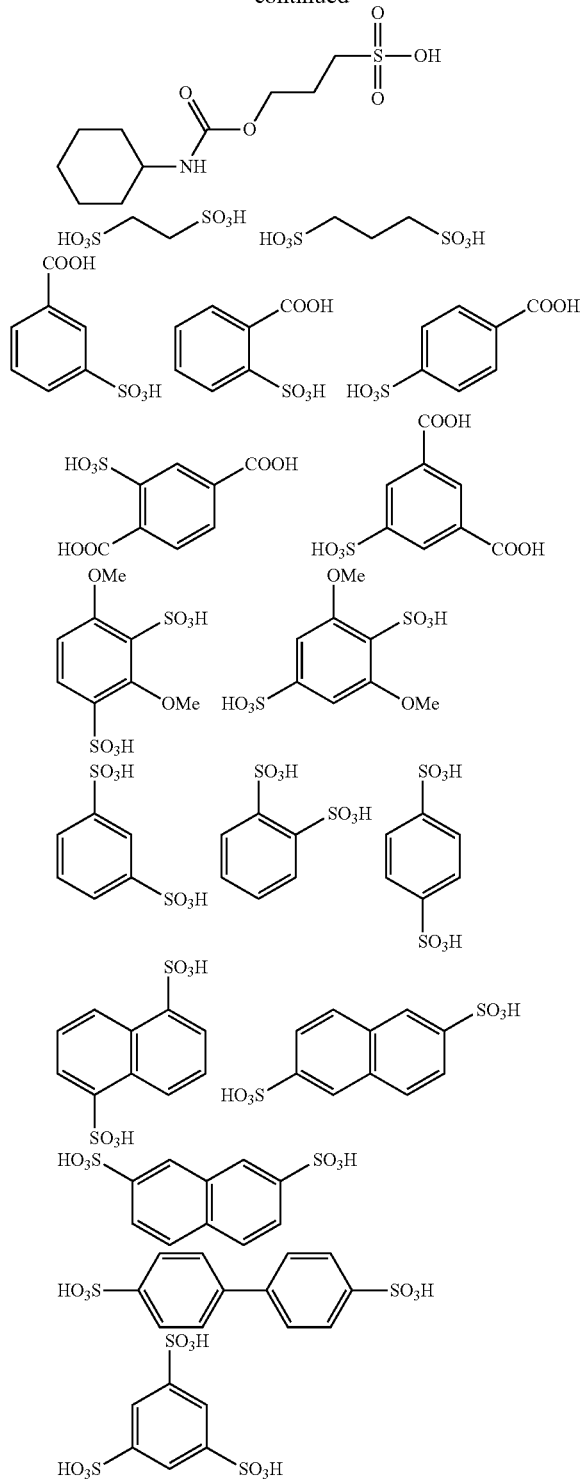

The sulfonic acid copper complex can be obtained by reacting a sulfonic acid compound which serves as a ligand or a salt thereof and a copper component.

As the copper component, copper or a compound containing copper can be used. As the compound containing copper, for example, a copper oxide or a copper salt can be used. The copper salt is preferably monovalent or divalent copper and more preferably divalent copper. The copper salt is more preferably copper acetate, copper chloride, copper formate, copper stearate, copper benzoate, copper ethylacetoacetate, copper pyrophosphate, copper naphthenate, copper citrate, copper nitrate, copper sulfate, copper carbonate, copper chlorate, copper (meth)acrylate, or copper perchlorate and still more preferably copper acetate, copper chloride, copper sulfate, copper benzoate, or copper (meth)acrylate.

As the sulfonic acid compound that can be used in the present invention, commercially available sulfonic acid can be used or can also be synthesized with reference to a well-known method. A salt of the sulfonic acid compound which can be used in the present invention is, for example, preferably a metal salt, and specific examples thereof include a sodium salt, a potassium salt, and the like.

As a copper compound that can be used in the present invention, in addition to the above-described copper compounds, a copper compound having a carboxylic acid as a ligand may be used. Carboxylic acid used in the copper compound having a carboxylic acid as a ligand is preferably, for example, a compound represented by General Formula (A7) below.

General Formula (A7)

In General Formula (A7), $R^4$ represents a monovalent organic group. The monovalent organic group is not particularly limited and is identical to $R^2$ which is the monovalent organic group in General Formula (A6) described above, and the preferred range thereof is also identical.

As the copper compound used in the present invention, a copper compound having a phosphoric acid ester as a ligand (phosphoric acid ester copper compound) can also be used. Regarding a phosphoric acid ester compound used as the phosphoric acid ester copper compound, Paragraphs "0015" to "0027" of JP2013-253224A can be referred to, and the content thereof is incorporated into the present specification.

In addition, as the copper compound that can be used in the present invention, it is possible to use a copper compound obtained from a reaction between a polymer including an acid group or a salt thereof and the copper component. The copper compound is, for example, a polymer-type copper compound including a polymer having an acid group ion portion and a copper ion, and a preferred aspect thereof is a polymer-type copper compound having an acid group ion portion in the polymer as a ligand. This polymer-type copper compound generally has an acid group ion portion in a side chain of the polymer, the acid group ion portion is bonded (for example, forms a coordination bond) to copper, and a crosslinking structure is formed between side chains from copper as a starting point. Examples of the polymer-type copper compound include a copper complex of a polymer having a carbon-carbon bond in the main chain, a copper complex of a polymer having a carbon-carbon bond in the main chain which includes a fluorine atom, a copper complex of a polymer having an aromatic hydrocarbon group and/or an aromatic heterocyclic group in the main chain (hereinafter, referred to as aromatic group-containing polymer), and the like.

The copper component is preferably a compound including divalent copper. The content of copper in the copper component is preferably in a range of 2% by mass to 40% by mass and more preferably in a range of 5% by mass to 40% by mass. Only one copper component may be used or two or more copper components may be jointly used. As the compound including copper, for example, a copper oxide or a copper salt can be used. The copper salt is preferably divalent copper. The copper salt is particularly preferably copper hydroxide, copper acetate, or copper sulfate.

The acid group included in the polymer including an acid group or a salt thereof is not particularly limited as long as the acid group is capable of reacting with the above-described copper component, but is preferably an acid group forming a coordination bond with the copper component. Specific examples thereof include acid groups having an acid dissociation constant (pKa) of 12 or lower, and a sulfonic acid group, a carboxylic acid group, a phosphoric acid group, a phosphonic acid group, a phosphinic acid group, an imide acid group, and the like are preferred. The polymer may have only one acid group or two or more acid groups.

Examples of an atom or an atomic group constituting the salt of the acid group used in the present invention include a metal atom (particularly, an alkali metal atom) such as sodium and an atomic group such as tetrabutyl ammonium. Furthermore, in the polymer including the acid group or a salt thereof, the acid group or the salt thereof may be included in either or both the main chain and the side chain and is preferably included in at least the side chain.

The polymer including the acid group or a salt thereof is preferably a polymer including a carboxylic acid group or a salt thereof and/or a sulfonic acid group or a salt thereof and more preferably a polymer including a sulfonic acid group or a salt thereof.

<<<Polymer Including First Acid Group or Salt Thereof>>

A preferred example of the polymer including the acid group or a salt thereof is a structure having a carbon-carbon bond in the main chain and preferably includes a constitutional unit represented by Formula (A8) described below.

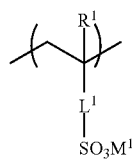

(A8)

In Formula (A8), $R^1$ represents a hydrogen atom or a methyl group, $L^1$ represents a single bond or a divalent linking group, and $M^1$ represents a hydrogen atom or an atom or an atomic group constituting a sulfonic acid group or a salt thereof.

In Formula (A8), $R^1$ is preferably a hydrogen atom.

In Formula (A8), in a case in which $L^1$ represents a divalent linking group, the divalent linking group is not particularly limited, and examples thereof include a divalent hydrocarbon group, a heteroarylene group, —O—, —S—, —CO—, —COO—, —OCO—, —SO$_2$—, —NX— (X represents a hydrogen atom or an alkyl group and is preferably a hydrogen atom), or a group formed of a combination thereof.

Examples of the divalent hydrocarbon group include linear, branched, or cyclic alkylene groups and arylene groups. The hydrocarbon group may have a substituent, but is preferably not substituted.

The number of carbon atoms in the linear alkylene group is preferably in a range of 1 to 30, more preferably in a range of 1 to 15, and still more preferably in a range of 1 to 6. In addition, the number of carbon atoms in the branched alkylene group is preferably in a range of 3 to 30, more preferably in a range of 3 to 15, and still more preferably in a range of 3 to 6.

The cyclic alkylene group may be either a monocyclic ring or a polycyclic ring. The number of carbon atoms in the cyclic alkylene group is preferably in a range of 3 to 20, more preferably in a range of 4 to 10, and still more preferably in a range of 6 to 10.

The number of carbon atoms in the arylene group is preferably in a range of 6 to 18, more preferably in a range of 6 to 14, and still more preferably in a range of 6 to 10, and a phenylene group is particularly preferred.

The heteroarylene group is not particularly limited, but is preferably a 5-membered or 6-membered ring. In addition, the heteroarylene group may be a monocyclic ring or a fused ring, is preferably a monocyclic ring or a fused ring having 2 to 8 fused sites and more preferably a monocyclic ring or a fused ring having 2 to 4 fused sites.

In Formula (A8) described above, an atom or an atomic group constituting a sulfonic acid group or a salt thereof represented by $M^1$ is identical to the above-described atom or atomic group constituting a salt of the acid group, and is preferably a hydrogen atom or an alkali metal atom.

Regarding constitutional units other than the constitutional unit represented by Formula (A8), the description of the copolymer component disclosed in Paragraphs "0068" to "0075" ("0112" to "0118" in the specification of the corresponding US2011/0124824A) of JP2010-106268A can be referred to, and the content thereof is incorporated into the present specification.

Examples of the other constitutional units that are preferred include constitutional units represented by Formula (A9) described below.

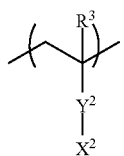

(A9)

In Formula (A9), $R^3$ represents a hydrogen atom or a methyl group and is preferably a hydrogen atom.

In Formula (A9), $Y^2$ represents a single bond or a divalent linking group, and the divalent linking group is identical to the divalent linking group in Formula (A8) described above. Particularly, $Y^2$ is preferably —COO—, —CO—, —NH—, a linear or branched alkylene group, or a group formed of a combination thereof or a single bond.

In Formula (A9), $X^2$ represents —PO$_3$H, —PO$_3$H$_2$, —OH, or —COOH and is preferably —COOH.

In a case in which the formula (A8) includes other constitutional units (preferably the constitutional unit represented by Formula (A9) described above), the molar ratio between the constitutional unit represented by Formula (A8) described above and the constitutional unit represented by Formula (A9) described above is preferably in a range of 95:5 to 20:80 and more preferably in a range of 90:10 to 40:60.

<<<Polymer Including Second Acid Group or Salt Thereof>>>

In addition, as the copper compound that can be used in the present invention, a copper compound obtained from a reaction between a polymer having an acid group or a salt thereof and further having a fluorine atom and a copper component may be used. When a polymer having an acid group or a salt thereof and a fluorine atom and a copper component are reacted together, for example, a polymer-type copper compound including an acid group ion site, a polymer having a fluorine atom, and a copper ion is obtained.

The acid group or the salt thereof and the copper component are identical to those in the above-described compound obtained from a reaction between the polymer including an acid group or a salt thereof and the copper component, and the preferred range thereof is also identical.

A preferred example of the polymer including an acid group or a salt thereof and a fluorine atom preferably has at least one constitutional unit out of constitutional units represented by Formulae (A10-1), (A10-2), and (A10-3) below.

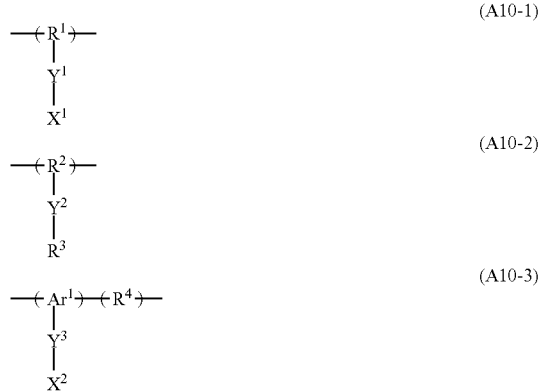

In Formula (A10-1), $R^1$ represents an aliphatic hydrocarbon group, $Y^1$ represents a single bond or a divalent linking group, $X^1$ represents an acid group or a salt thereof, and at least one of $R^1$ and $Y^1$ is substituted with a fluorine atom.

In Formula (A10-2), $R^2$ represents an aliphatic hydrocarbon group, $R^3$ represents a hydrocarbon group, $Y^2$ represents a single bond or a divalent linking group, and at least one of $R^2$, $R^3$, and $Y^2$ is substituted with a fluorine atom.

In Formula (A10-3), $Ar^1$ represents an aromatic hydrocarbon group and/or an aromatic heterocyclic group, $R^4$ represents an organic group, $Y^3$ represents a single bond or a divalent linking group, $X^2$ represents an acid group or a salt thereof, and at least one of $Ar^1$, $R^4$, and $Y^3$ is substituted with a fluorine atom.

In Formulae (A10-1) and (A10-2), each of $R^1$ and $R^2$ independently represents an aliphatic hydrocarbon group, and examples thereof include linear, branched, or cyclic alkyl groups. The number of carbon atoms in the linear alkyl group is preferably in a range of 1 to 20, more preferably in a range of 1 to 10, and still more preferably in a range of 1 to 6. The number of carbon atoms in the branched alkyl group is preferably in a range of 3 to 20, more preferably in a range of 3 to 10, and still more preferably in a range of 3 to 6. The cyclic alkyl group may be either a monocyclic ring or a polycyclic ring. The number of carbon atoms in the cyclic alkyl group is preferably in a range of 3 to 20, more preferably in a range of 4 to 10, and still more preferably in a range of 6 to 10.

In a case in which $R^1$ and $R^2$ have a substituent, the substituent is not particularly limited. Examples of the substituent include a polymerizable group (preferably a polymerizable group having a carbon-carbon double bond), a halogen atom (a fluorine atom, a chlorine atom, a bromine atom, or an iodine atom), an alkyl group, a carboxylic acid ester group, a halogenated alkyl group, an alkoxy group, a methacryloyloxy group, an acryloyloxy group, an ether group, a sulfonyl group, a sulfide group, an amide group, an acyl group, a hydroxy group, a carboxyl group, an aralkyl group, —Si—$(OR^{N22})_3$, and the like, and a fluorine atom is particularly preferred. ($R^{N22}$ represents an alkyl group, and the number of carbon atoms is preferably in a range of 1 to 3.)

In a case in which each of $Y^1$ to $Y^3$ in Formulae (A10-1) to (A10-3) independently represents a divalent linking group, the divalent linking group is identical to the above-described divalent linking group in Formula (A8).

Examples of the hydrocarbon group include linear, branched, or cyclic alkylene groups or arylene groups. The number of carbon atoms in the linear alkylene group is preferably in a range of 1 to 20, more preferably in a range of 1 to 10, and still more preferably in a range of 1 to 6. In addition, the number of carbon atoms in the branched alkylene group is preferably in a range of 3 to 20, more preferably in a range of 3 to 10, and still more preferably in a range of 3 to 6. The cyclic alkylene group may be either a monocyclic ring or a polycyclic ring. The number of carbon atoms in the cyclic alkylene group is preferably in a range of 3 to 20, more preferably in a range of 4 to 10, and still more preferably in a range of 6 to 10.

The arylene group and the heteroarylene group are identical to those in a case in which the above-described divalent linking group in Formula (A6) is an arylene group.

Particularly, in a case in which $Y^1$ is a divalent linking group, the divalent linking group is preferably —COO—, —CO—, —O—, —NX— (X represents a hydrogen atom or an alkyl group and is preferably a hydrogen atom), a hydrocarbon group (preferably an alkylene group or an arylene group having 1 to 30 carbon atoms), or a group formed of a combination thereof.

In Formulae (A10-1) and (A10-3), each of $X^1$ and $X^2$ independently represents an acid group or a salt thereof and is identical to the above-described acid group or the salt thereof, and the preferred range thereof is also identical.

In addition, in Formula (A10-1), at least one of $R^1$ and $Y^1$ is substituted with one fluorine atom. Here, when, out of $R^1$ and $Y^1$, $Y^1$ is substituted with a fluorine atom, it means that, for example, at least one hydrogen atom constituting $R^1$ is substituted with a fluorine atom. At least one of $R^1$ and $Y^1$ is preferably a perfluoro group. Out of $R^1$ and $Y^1$, $Y^1$ is preferably substituted with a fluorine atom.

In Formula (A10-2), $R^3$ represents a hydrocarbon group, and examples thereof include the alkyl group described in the section of $R^1$ in Formula (A10-1) and an aryl group. The alkyl group is identical to the alkyl group described in the section of $R^1$ in Formula (A10-1), and the preferred range thereof is also identical. The number of carbon atoms in the aryl group is preferably in a range of 6 to 18, more preferably in a range of 6 to 14, and further more preferably in a range of 6 to 10. In a case in which $R^3$ has a substituent, the substituent is not particularly limited, but is preferably a fluorine atom.

In Formula (A10-2), it is preferable that at least one of $R^2$, $R^3$, and $Y^2$ has a fluorine atom, and at least one of $R^2$, $R^3$, and $Y^2$ is a perfluoro group.

In Formula (A10-3), $Ar^1$ preferably represents an aromatic hydrocarbon group. The aromatic hydrocarbon group is preferably an aryl group having 6 to 20 carbon atoms and more preferably a phenyl group or a biphenyl group. The aromatic heterocyclic group is not particularly limited, and, for example, an aromatic heterocyclic group having 2 to 30 carbon atoms can be used.

In Formula (A10-3), $R^4$ represents an organic group, and examples thereof include an alkylene group having 1 to 6 carbon atoms, a cycloalkylene group having 1 to 6 carbon atoms, —O—, —SO$_2$—, —CO—, —NR$_N$— (R$_N$ represents a hydrogen atom or an alkyl group), and combinations thereof. $R^4$ as the alkylene group is preferably an alkylene group having 1 carbon atom and, particularly, preferably includes —C(R$^{4A}$)(R$^{4B}$)—. Here, each of R$^{4A}$ and R$^{4B}$ independently represents a fluorine atom or an alkyl group (preferably an alkyl group having 1 to 3 carbon atoms), and the alkyl group may be substituted with a fluorine atom. In a case in which $R^4$ includes —C(R$^{4A}$)(R$^{4B}$)—, one R$^{4A}$ and one R$^{4B}$ may bond to each other and thus form a ring.

$R^4$ as the cycloalkylene group is preferably a cycloalkylene group having 4 carbon atoms and, particularly, a perfluorocyclobutylene group is preferred.

Preferred examples of $R^4$ include —C(R$^{4A}$)(R$^{4B}$)—, —O—, —CO—, and —SO$_2$—.

In Formula (A10-3), it is preferable that at least one of $Ar^1$, $R^4$, and $Y^3$ has a fluorine atom, and at least one of $Ar^1$, $R^4$, and $Y^3$ is a perfluoro group.

In addition, a constitutional unit represented by Formula (A10-3) may have one or more $Ar^1$'s and one or more $R^4$'s in the constitutional unit and may have two or more $Ar^1$'s and two or more $R^4$'s.

The weight-average molecular weight of the polymer including the acid group or a salt thereof and a fluorine atom is preferably 2,000 or higher, more preferably in a range of 2,000 to 2,000,000, and still more preferably in a range of 5,000 to 400,000.

<<<Polymer Including Third Acid Group or Salt Thereof>>>

As the copper compound that can be used in the present invention, a polymer-type copper compound obtained from a reaction between the aromatic group-containing polymer and a copper component may be used. The aromatic group-containing polymer may have at least one of an aromatic hydrocarbon group and an aromatic heterocyclic group in the main chain or may have two or more thereof. The acid group or a salt thereof and the copper component are identical to those in the above-described copper compound obtained from a reaction between the polymer including the acid group or a salt thereof and the copper component, and the preferred range thereof is also identical.

The aromatic hydrocarbon group is preferably, for example, an aryl group. The number of carbon atoms in the aryl group is preferably in a range of 6 to 20, more preferably in a range of 6 to 15, and still more preferably in a range of 6 to 12. Particularly, a phenyl group, a naphthyl group, or a biphenyl group is preferred. The aromatic hydrocarbon group may be a monocyclic ring or a polycyclic ring, but is preferably a monocyclic ring.

As the aromatic heterocyclic group, it is possible to use, for example, an aromatic heterocyclic group having 2 to 30 carbon atoms. The aromatic heterocyclic group is preferably a 5-membered ring or a 6-membered ring. In addition, the aromatic heterocyclic group is a monocyclic ring or a fused ring, and examples thereof include a monocyclic ring and fused rings having 2 to 8 fused portions. Examples of the hetero atom included in the heterocyclic ring include a nitrogen atom, an oxygen atom, and a sulfur atom, and a nitrogen atom or an oxygen atom is preferred.

In a case in which the aromatic hydrocarbon group and/or the aromatic heterocyclic group have a substituent T, examples of the substituent T include an alkyl group, a polymerizable group (preferably a polymerizable group having a carbon-carbon double bond), a halogen atom (a fluorine atom, a chlorine atom, a bromine atom, or an iodine atom), a carboxylic acid ester group, a halogenated alkyl group, an alkoxy group, a methacryloyloxy group, an acryloyloxy group, an ether group, a sulfonyl group, a sulfide group, an amide group, an acyl group, a hydroxy group, a carboxyl group, and an aralkyl group, and an alkyl group (particularly, an alkyl group having 1 to 3 carbon atoms) is preferred.

Particularly, the aromatic group-containing polymer is preferably at least one polymer selected from a polyether sulfone-based polymer, a polysulfone-based polymer, a polyether ketone-based polymer, a polyphenylene ether-based polymer, a polyimide-based polymer, a polybenzimidazole-based polymer, a polyphenylene-based polymer, a phenol resin-based polymer, a polycarbonate-based polymer, a polyamide-based polymer, and a polyester-based polymer. Hereinafter, examples of the respective polymers will be described.

Polyether sulfone-based polymer: a polymer having a main chain structure represented by (—O-Ph-SO$_2$-Ph-) (Ph represents a phenylene group, which shall apply below)

Polysulfone-based polymer: a polymer having a main chain structure represented by (—O-Ph-Ph-O-Ph-SO$_2$-Ph-)

Polyether ketone-based polymer: a polymer having a main chain structure represented by (—O-Ph-O-Ph-C(=O)-Ph-)

Polyphenylene ether-based polymer: a polymer having a main chain structure represented by (-Ph-O—, -Ph-S—)

Polyphenylene-based polymer: a polymer having a main chain structure represented by (-Ph-)

Phenol resin-based polymer: a polymer having a main chain structure represented by (-Ph(OH)—CH$_2$—)

Polycarbonate-based polymer: a polymer having a main chain structure represented by (-Ph-O—C(=O)—O—)

as the polyamide-based polymer, for example, a polymer having a main chain structure represented by (-Ph-C(=O)—NH—)

as the polyester-based polymer, for example, a polymer having a main chain structure represented by (-Ph-C(=O)O—)

Regarding the polyether sulfone-based polymer, the polysulfone-based polymer, and the polyether ketone-based polymer, for example, the main chain structures described in Paragraph "0022" of JP2006-310068A and Paragraph "0028" of JP2008-27890A can be referred to, and the contents thereof are incorporated into the present specification.

Regarding the polyimide-based polymer, the main chain structures described in Paragraphs "0047" to "0058" of JP2002-367627A and Paragraphs "0018" and "0019" of JP2004-35891A can be referred to, and the contents thereof are incorporated into the present specification.

As an example of the aromatic group-containing polymer, the polymer preferably has a constitutional unit represented by Formula (A11) below.

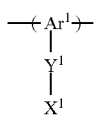
(A11)

In Formula (A11), $Ar^1$ represents an aromatic hydrocarbon group and/or an aromatic heterocyclic group, $Y^1$ represents a single bond or a divalent linking group, and $X^1$ represents an acid group or a salt thereof.

In Formula (A11), in a case in which $Ar^1$ represents an aromatic hydrocarbon group, the aromatic hydrocarbon group is identical to the above-described aromatic hydrocarbon group, and the preferred range thereof is also identical. In a case in which Ar' represents an aromatic heterocyclic group, the aromatic heterocyclic group is identical to the above-described aromatic heterocyclic group, and the preferred range thereof is also identical.

$Ar^1$ may have a substituent in addition to —$Y^1$—$X^1$ in Formula (A11) described above. In a case in which $Ar^1$ has a substituent, the substituent is identical to the above-described substituent T, and the preferred range thereof is also identical.

In Formula (A11), $Y^1$ is preferably a single bond. In a case in which $Y^1$ is a divalent linking group, examples of the divalent linking group include a hydrocarbon group, an aromatic heterocyclic group, —O—, —S—, —SO$_2$—, —CO—, —O—C(=O)—, —NX— (X represents a hydrogen atom or an alkyl group and is preferably a hydrogen atom), —C($R^{Y1}$)($R^{Y2}$)—, or a group formed of a combination thereof. Here, each of $R^{Y1}$ and $R^{Y2}$ independently represents a hydrogen atom, a fluorine atom, or an alkyl group.

Examples of the hydrocarbon group include linear, branched, or cyclic alkylene groups or arylene groups. The number of carbon atoms in the linear alkylene group is preferably in a range of 1 to 20, more preferably in a range of 1 to 10, and still more preferably in a range of 1 to 6. The number of carbon atoms in the branched alkylene group is preferably in a range of 3 to 20, more preferably in a range of 3 to 10, and still more preferably in a range of 3 to 6. The cyclic alkylene group may be either a monocyclic ring or a polycyclic ring. The number of carbon atoms in the cyclic alkylene group is preferably in a range of 3 to 20, more preferably in a range of 4 to 10, and still more preferably in a range of 6 to 10. In these linear, branched, or cyclic alkylene groups, the hydrogen atom in the alkylene group may be substituted with a fluorine atom.

The arylene group is identical to that in a case in which the divalent linking group in Formulae (A10-1) to (A10-3) described above is an arylene group.

The aromatic heterocyclic group is not particularly limited, but is preferably a 5-membered ring or a 6-membered ring. In addition, the aromatic heterocyclic group may be a monocyclic ring or a fused ring, is preferably a monocyclic ring or a fused ring having 2 to 8 fused portions, and more preferably a monocyclic ring or a fused ring having 2 to 4 fused portions.

In Formula (A11), the acid group or a salt thereof represented by $X^1$ is identical to the above-described acid group or a salt thereof, and the preferred range thereof is also identical.

In addition, as the near infrared-absorbing compound that can be used in the present invention, the copper compound described in Paragraph "0019" of JP2013-050593A can be used, and the content thereof is incorporated into the present specification.

As a phthalocyanine-based compound, a naphthalocyanine compound, an immonium-based compound, a cyanine-based pigment, a squarylium-based pigment, and a croconium compound, the compounds disclosed in Paragraphs "0010" to "0081" of JP2010-111750A may be used, and the content thereof is incorporated into the present specification. Regarding the cyanine-based pigment, for example, "Functional Pigment, Makoto Okawara/Masaru Matsuoka/Teijiro Kitao/Tsuneaki Hirashima, Kodansha Scientific" can be referred to, and the content thereof is incorporated into the present specification.

In addition, in the present invention, as the near infrared-absorbing pigment (A), the compound disclosed in Paragraphs "0004" to "0016" of JP1995-164729A (JP-H07-164729A), the compound disclosed in Paragraphs "0027" to "0062" of JP2002-146254A, or the near infrared-absorbing particles, which are made up of crystallites of an oxide including Cu and/or P and have a number-average aggregated particle diameter in a range of 5 nm to 200 nm, disclosed in Paragraphs "0034" to "0067" of JP2011-164583A may be used, and the contents thereof are incorporated into the present specification.

Additionally, in the present invention, "EX COLOR IR-10", "EX COLOR IR-12", "EX COLOR IR-14", "EX COLOR HA-1", and "EX COLOR HA-14" (all trade names, manufactured by Nippon Shokubai Co., Ltd.), "SIR-128", "SIR-130", "SIR-132", "SIR-152", "SIR-159", and "SIR-162" (all trade names, manufactured by Mitsui Chemicals, Inc.), "Kayasorb IRG-022", "Kayasorb IRG-023", and "Kayasorb IRG-040" (all trade names, manufactured by Nippon Kayaku Co., Ltd.), "CIR-1081" (trade name, manufactured by Japan Carlit Co., Ltd.), "NIR-IM1" and "NIR-AM1" (all trade names, manufactured by Nagase ChemteX Corporation), cesium oxide tungsten compounds (YMF-02A, YMF-01A-2, and YMF-10A-1 manufactured by Sumitomo Metal Mining Co., Ltd.), "Lumogen IR765" and "Lumogen IR788" (manufactured by BASF), "ARS670T", "IRA800", "IRA850", and "IRA868" (manufactured by Exciton), and the like can be used.

The content of the near infrared-absorbing pigment in the composition of the present invention can be adjusted to be a desired value as necessary, and is preferably set in a range of 0.01% by mass to 50% by mass, more preferably set in a range of 0.1% by mass to 30% by mass, and still more preferably set in a range of 0.5% by mass to 15% by mass of all solid contents in the composition. In addition, the content of the near infrared-absorbing pigment is preferably 0.01% by mass or higher, more preferably 0.1% by mass or higher, and still more preferably 0.5% by mass or higher of all the solid contents in the composition. When the content of the near infrared-absorbing pigment is within the above-described range, it is possible to impart a favorable near infrared-absorbing function. In a case in which the composition of the present invention includes two or more near infrared-absorbing pigments, the total amount thereof is preferably within the above-described range.

<<Curable Compound (B)>>

The curable compound (B) used in the present invention has one or more atoms or groups selected from a fluorine atom, a silicon atom, a linear alkyl group having 8 or more carbon atoms, and a branched alkyl group having 3 or more carbon atoms and preferably has a fluorine atom and/or a branched alkyl group having 6 or more carbon atoms.

In addition, the curable compound (B) has one or more atoms or groups selected from a fluorine atom, a silicon atom, a linear alkyl group having 8 or more carbon atoms, and a branched alkyl group having 3 or more carbon atoms and, when having a curable functional group, may be a monomer, a multimer, or a polymer.

In a case in which the curable compound (B) includes a fluorine atom, the curable compound (B) preferably has an alkyl group substituted with a fluorine atom and/or an aryl group substituted with a fluorine atom.

The alkyl group substituted with a fluorine atom is preferably a linear, branched, or cyclic alkyl group in which at least one hydrogen atom is substituted with a fluorine atom.

The number of carbon atoms in the linear or branched alkyl group substituted with a fluorine atom is preferably in a range of 1 to 20 and more preferably in a range of 1 to 10. In addition, the cyclic alkyl group substituted with a fluorine atom is preferably a monocyclic or polycyclic cycloalkyl group in which at least one hydrogen atom is substituted with a fluorine atom. The aryl group substituted with a fluorine atom is preferably an aryl group in which at least one hydrogen atom is substituted with a fluorine atom. Examples of the aryl group include a phenyl group.

The alkyl group substituted with a fluorine atom preferably has a trifluoromethyl group at the terminal.

In the aryl group substituted with a fluorine atom, it is preferable that the aryl group is directly substituted with a fluorine atom or is substituted with a trifluoromethyl group.

The alkyl group substituted with a fluorine atom and the aryl group substituted with a fluorine atom may further have a substituent other than the fluorine atom, but is preferably substituted with only a fluorine atom or an alkyl group having a fluorine atom.

Regarding examples of the alkyl group substituted with a fluorine atom and the aryl group substituted with a fluorine atom, for example, Paragraphs "0266" to "0272" of JP2011-100089A can be referred to, and the content thereof is incorporated into the present specification.

In a case in which the curable compound (B) includes a silicon atom, the curable compound preferably includes an alkylsilyl group, an arylsilyl group, or a partial structure (S) below (* represents a bonding site to other atoms).

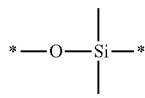

Partial structure (S)

The total number of carbon atoms in an alkyl chain included in the alkylsilyl group is preferably in a range of 1 to 20, more preferably in a range of 1 to 10, and still more preferably in a range of 1 to 6. The alkylsilyl group is a trialkylsilyl group.

Examples of the aryl group in the arylsilyl group include a phenyl group.

In a case in which the curable compound includes the partial structure (S), the curable compound may form a ring structure by including the partial structure (S). The partial structure (S) that is preferably employed in the present invention is preferably —Si(R)$_2$—O—Si(R)$_2$— (R represents an alkyl group having 1 to 3 carbon atoms) or an alkoxysilyl group. Regarding examples of a structure including the partial structure (S), for example, Paragraphs "0277" to "0279" of JP2011-100089A can be referred to, and the content thereof is incorporated into the present specification.

In a case in which the curable compound (B) includes a linear alkyl group having 8 or more carbon atoms, the number of carbon atoms is preferably in a range of 8 to 30 and more preferably in a range of 12 to 20.

In a case in which the curable compound (B) includes a branched alkyl group having 3 or more carbon atoms, the number of carbon atoms in the branched alkyl group is preferably in a range of 3 to 20 and more preferably in a range of 5 to 15. The branched alkyl group having 3 or more carbon atoms preferably has —CH(CH$_3$)$_2$ and —C(CH$_3$)$_3$ at the terminal.

The number of one or more atoms or groups selected from a fluorine atom, a silicon atom, a linear alkyl group having 8 or more carbon atoms, and a branched alkyl group having 3 or more carbon atoms included in the curable compound (B) may be one or more and may be two or more. In addition, the curable compound (B) may have a combination of one or more atoms or groups selected from a fluorine atom, a silicon atom, a linear alkyl group having 8 or more carbon atoms, and a branched alkyl group having 3 or more carbon atoms.

The curable compound (B) generally has one or more curable functional groups and may have two or more curable functional groups. The number of kinds of the curable functional group may be one or more. The curable functional group may be a thermosetting functional group or a photocurable functional group.

The curable functional group is preferably one or more selected from a (meth)acryloyloxy group, an epoxy group, an oxetanyl group, an isocyanate group, a hydroxyl group, an amino group, a carboxyl group, a thiol group, an alkoxysilyl group, a methylol group, a vinyl group, a (meth)acrylamide group, a styryl group, and a maleimide group and more preferably one or more selected from a (meth)acryloyloxy group, an epoxy group, and an oxetanyl group.

In a case in which the curable compound (B) is a monomer, the number of one or more groups selected from a fluorine atom, a silicon atom, a linear alkyl group having 8 or more carbon atoms, and a branched alkyl group having 3 or more carbon atoms in one molecule is preferably in a range of 1 to 20 and more preferably in a range of 3 to 15. In addition, the number of the curable functional groups in one molecule is preferably in a range of 1 to 10 and more preferably in a range of 2 to 6.

In a case in which the curable compound (B) is a polymer, the curable compound (B) preferably has one or more atoms or groups selected from a fluorine atom, a silicon atom, a linear alkyl group having 8 or more carbon atoms, and a branched alkyl group having 3 or more carbon atoms and more preferably has at least a repeating unit represented by Formula (B1) or (B2) below.

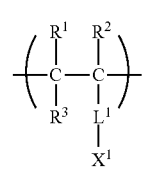

Formula (B1)

-continued

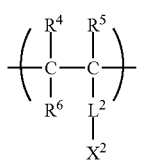
Formula (B2)

In Formulae (B1) and (B2), each of $R^1$ to $R^6$ independently represents a hydrogen atom, an alkyl group, or a halogen atom, each of $L^1$ and $L^2$ independently represents a single bond or a divalent linking group, $X^1$ represents a (meth)acryloyloxy group, an epoxy group, or an oxetanyl group, and $X^2$ represents an alkyl group substituted with a fluorine atom, an aryl group substituted with a fluorine atom, an alkylsilyl group, an arylsilyl group, a group having the above-described partial structure (S), a linear alkyl group having 8 or more carbon atoms, or a branched alkyl group having 3 or more carbon atoms.

In Formulae (B1) and (B2), each of $R^1$ to $R^6$ is preferably a hydrogen atom or an alkyl group. In a case in which each of $R^1$ to $R^6$ represents an alkyl group, an alkyl group having 1 to 3 carbon atoms is preferred. In a case in which each of $R^1$ to $R^6$ represents a halogen atom, a fluorine atom is preferred.

In a case in which each of $L^1$ and $L^2$ in Formulae (B1) and (B2) represents a divalent linking group, at least one group selected from alkylene groups having 2 to 10 carbon atoms and arylene groups having 6 to 12 carbon atoms or a group formed of a combination of the above-described groups and at least one group selected from —$NR^7$—, —$CONR^7$—, —$CO_2$—, —$SO_2NR^7$—, —O—, —S—, and —$SO_2$— is preferred, and an alkylene group having 2 to 10 carbon atoms, —$CO_2$—, —O—, —$CONR^7$—, or a group formed of a combination of the above-described groups is more preferred. Here, $R^7$ represents a hydrogen atom or a methyl group.

In a case in which $X^2$ in Formula (B2) represents an alkyl group or aryl group substituted with a fluorine atom, the alkyl group or aryl group substituted with a fluorine atom is identical to the above-described alkyl group or aryl group substituted with a fluorine atom, and the preferred range thereof is also identical. In addition, in a case in which $X^2$ represents an alkylsilyl group, an arylsilyl group, or a group having the partial structure (S), the alkylsilyl group, the arylsilyl group, and the group having the partial structure (S) are identical to those in a case in which the curable compound (B) described above includes a silicon atom, and the preferred ranges thereof are also identical.

In a case in which $X^2$ represents a linear alkyl group having 8 or more carbon atoms or a branched alkyl group having 3 or more carbon atoms, the linear alkyl group having 8 or more carbon atoms and the branched alkyl group having 3 or more carbon atoms are identical to the above-described linear alkyl group having 8 or more carbon atoms and the branched alkyl group having 3 or more carbon atoms, and the preferred ranges thereof are also identical.

Specific examples of a repeating unit represented by Formula (B1) described above will be illustrated below, but the present invention is not limited thereto.

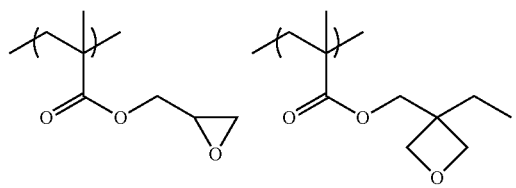

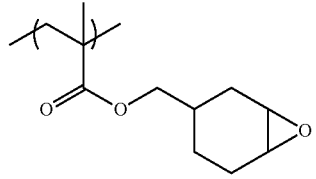

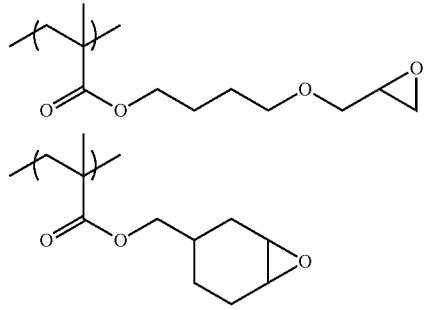

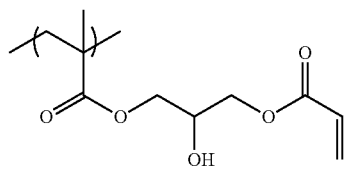

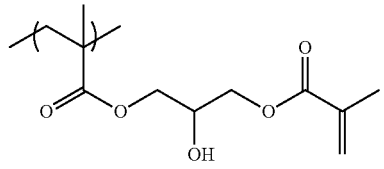

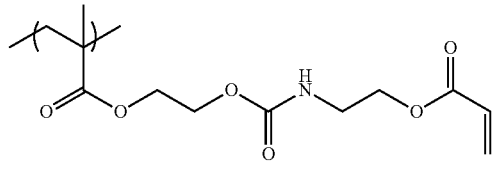

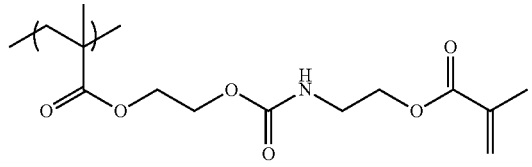

In addition, specific examples of a repeating unit represented by Formula (B2) described above will be illustrated below, but the present invention is not limited thereto. Specifically, $X^1$ represents a hydrogen atom, —$CH_3$, —F, or —$CF_3$ and is more preferably a hydrogen atom or a methyl group. Me represents a methyl group.

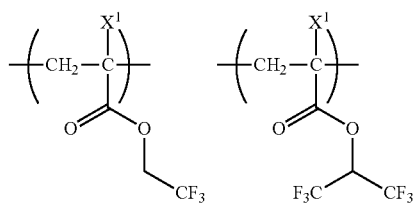

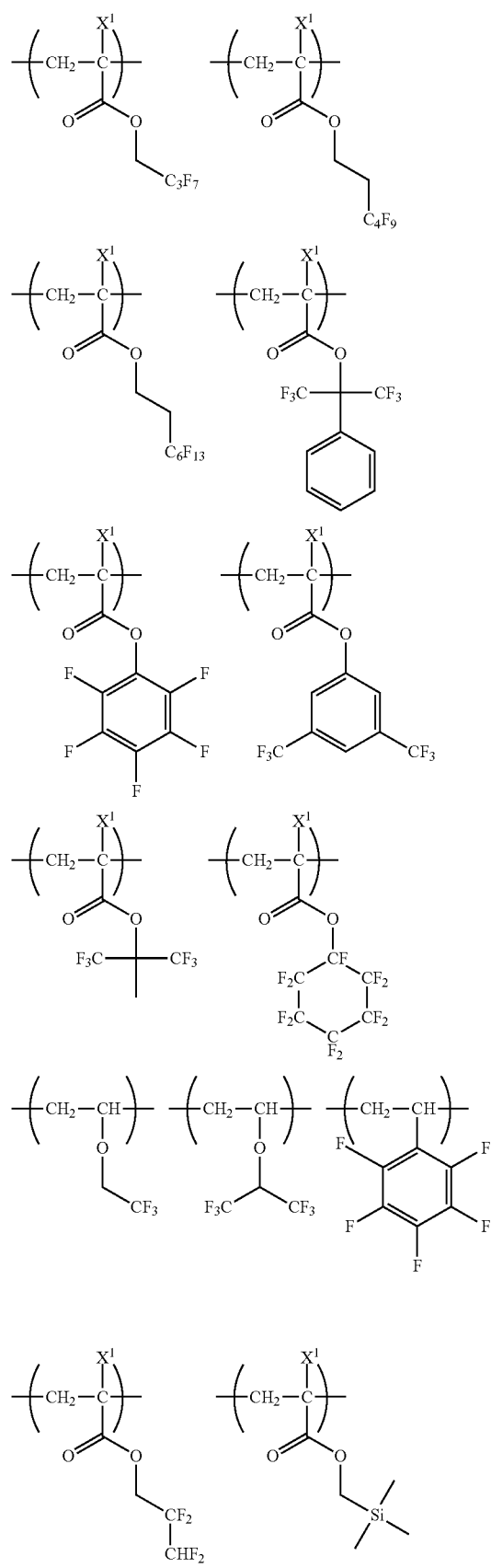
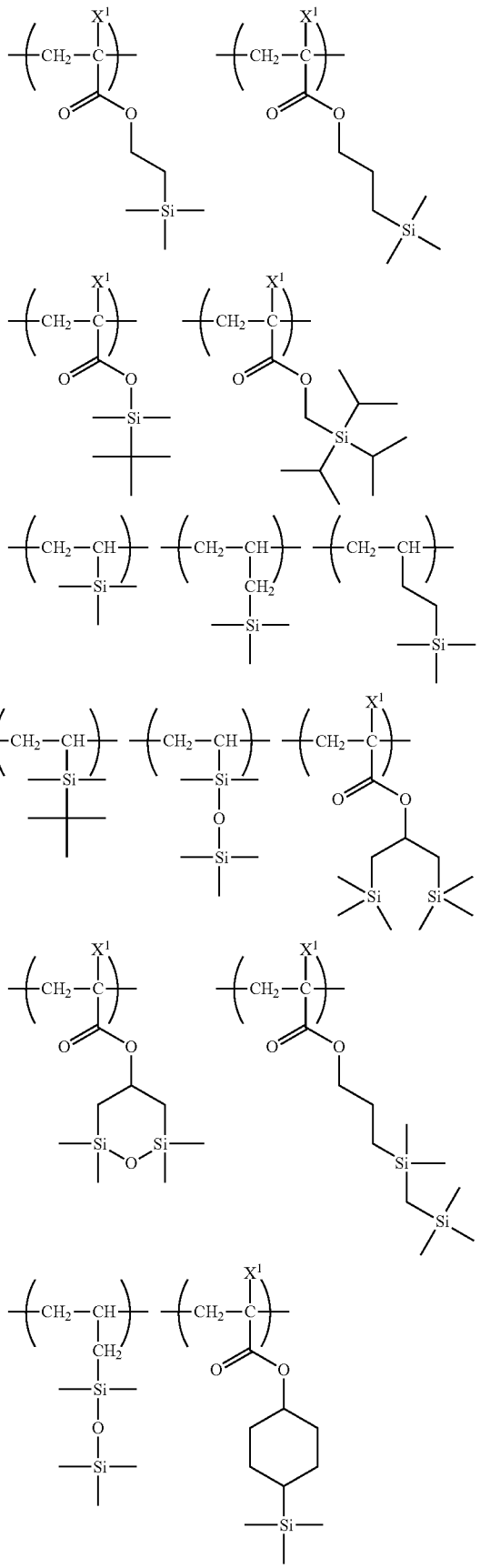

-continued
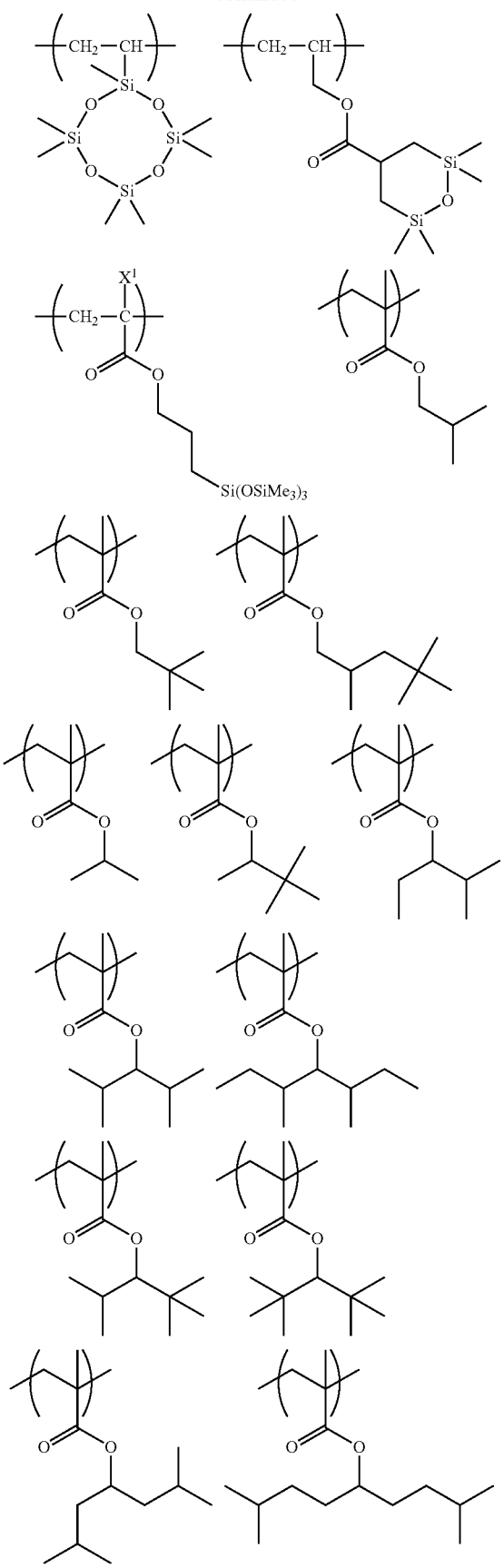
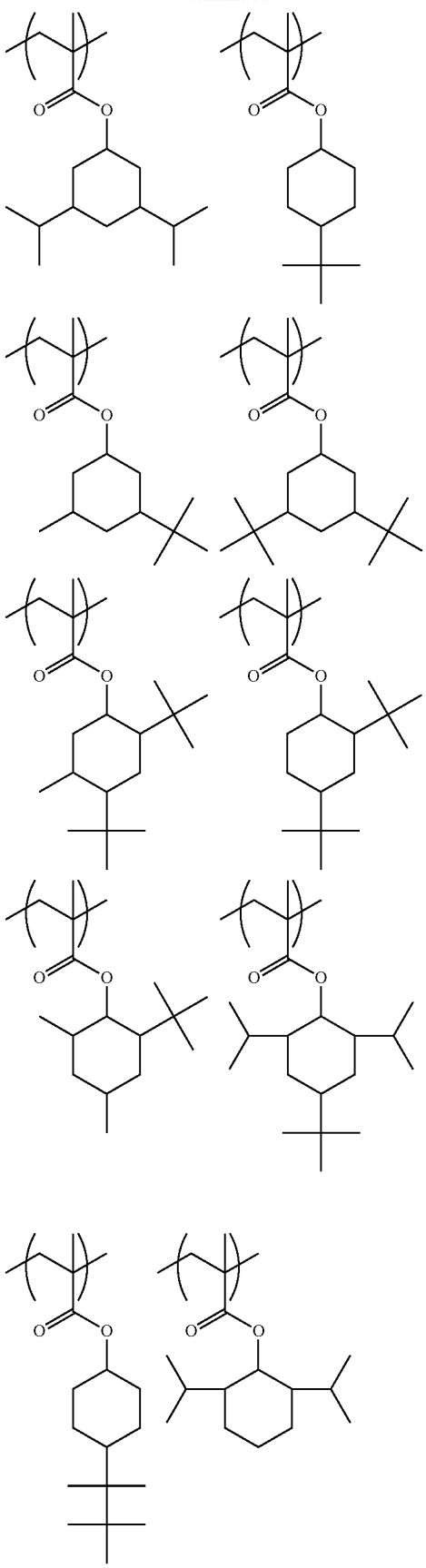

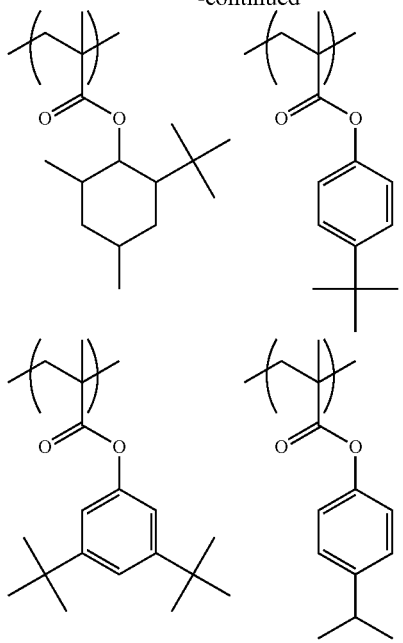

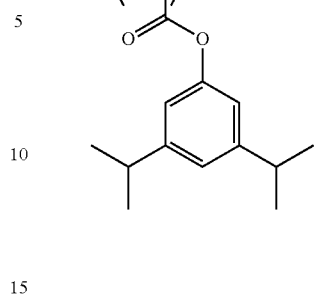

Specific examples of the curable compound (B) being a polymer having at least the repeating unit represented by Formula (B1) or (B2) described above will be illustrated below, but the present invention is not limited thereto. The compositional ratios of the repeating units (molar ratio; sequentially correspond from the left), the weight-average molecular weights, and the dispersities will be shown in the following table.

TABLE 2

| Curable compound (B) | Structural Formula | Compositional ratio (mol %) | Mw | Mw/Mn |
|---|---|---|---|---|
| B-1 | | 75/25 | 13300 | 2.26 |
| B-2 | | 75/25 | 27500 | 2.44 |
| B-3 | | 80/20 | 16700 | 2.31 |

TABLE 2-continued
| Curable compound (B) | Structural Formula | Compositional ratio (mol %) | Mw | Mw/Mn |
|---|---|---|---|---|
| B-4 | 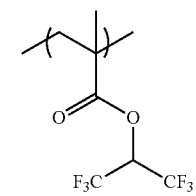 | 85/15 | 18200 | 2.36 |
| B-5 | 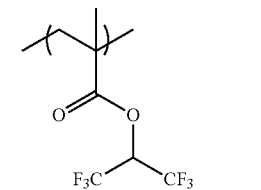 | 75/15 | 18900 | 2.37 |
| B-6 | 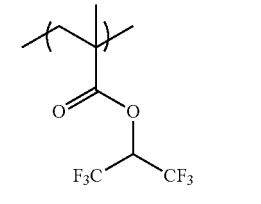 | 65/35 | 9200 | 2.16 |
| B-7 | 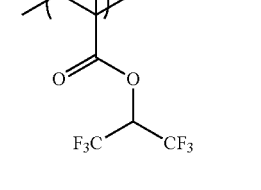 | 60/40 | 14200 | 2.29 |

TABLE 2-continued
| Curable compound (B) | Structural Formula | Compositional ratio (mol %) | Mw | Mw/Mn |
|---|---|---|---|---|
|  | 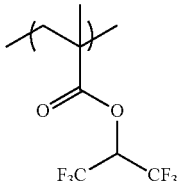 |  |  |  |
| B-8 | 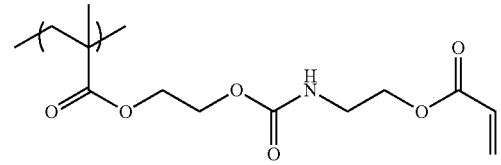 | 65/35 | 34800 | 2.56 |
| B-9 | 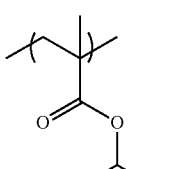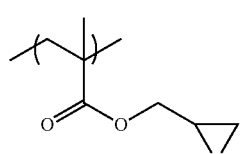 | 75/25 | 15000 | 2.78 |
| B-10 | 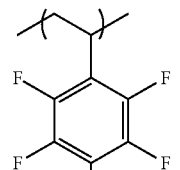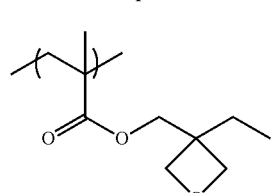 | 80/20 | 8400 | 2.17 |
| B-11 | 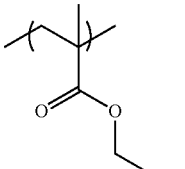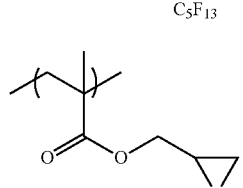 | 50/50 | 12900 | 2.30 |

TABLE 2-continued

| Curable compound (B) | Structural Formula | Compositional ratio (mol %) | Mw | Mw/Mn |
|---|---|---|---|---|
| B-12 | 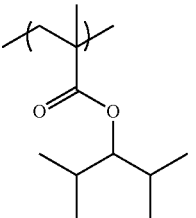 | 60/40 | 24500 | 2.64 |
| B-13 | 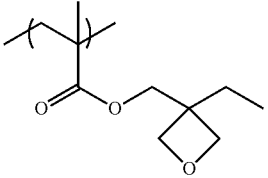 | 70/30 | 13200 | 2.33 |
| B-14 | 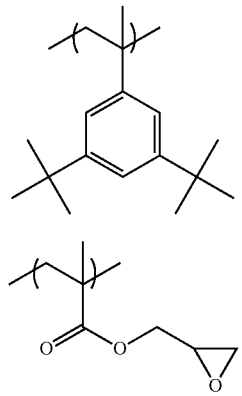 | 75/25 | 11400 | 2.07 |
|  | 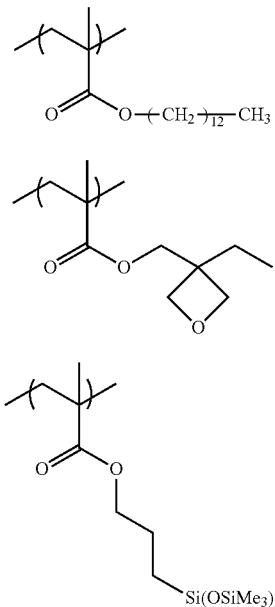 |  |  |  |

The proportion of the repeating unit represented by Formula (B1) described above is preferably in a range of 30% by mole to 95% by mole and more preferably in a range of 45% by mole to 90% by mole of all constitutional units in the curable compound (B). The proportion of the repeating unit represented by Formula (B1) is preferably 30% by mole or higher and more preferably 45% by mole or higher of all the constitutional units in the curable compound (B).

The proportion of the repeating unit represented by Formula (B2) described above is preferably in a range of 5% by mole to 70% by mole and more preferably in a range of 10% by mole to 60% by mole of all the constitutional units in the curable compound (B). The proportion of the repeating unit represented by Formula (B2) is preferably 5% by mole or higher and more preferably 10% by mole or higher of all the constitutional units in the curable compound (B).

In addition, the curable compound (B) may have a repeating unit other than the repeating units represented by Formulae (B1) and (B2) described above. The proportion of the repeating unit is preferably 10% by mole or lower and more preferably 1% by mole or lower of all the constitutional units in the curable compound (B).

In a case in which the curable compound (B) is a polymer, the weight-average molecular weight (Mw: polystyrene-equivalent) is preferably in a range of 5,000 to 100,000 and more preferably in a range of 7,000 to 50,000. In a case in which the curable compound (B) is a polymer, the weight-average molecular weight is preferably 5,000 or higher and more preferably 7,000 or higher.

In addition, in a case in which the curable compound (B) is a polymer, the dispersity (weight-average molecular weight (Mw)/number-average molecular weight (Mn)) is preferably in a range of 1.80 to 3.00 and more preferably in a range of 2.00 to 2.90. In a case in which the curable compound (B) is a polymer, the dispersity is preferably 1.80 or higher and more preferably 2.00 or higher.

In addition, regarding commercially available products of the curable compound (B), examples of the curable compound having a fluorine atom include MEGAFAC RS-72-K, MEGAFAC RS-75, MEGAFAC RS-76-E, MEGAFAC RS-76-NS, and MEGAFAC RS-77 all of which are manufactured by DIC Corporation; examples of the curable compound having a silicon atom include BYK-UV 3500, BYK-UV 3530, and BYK-UV 3570 all of which are manufactured by BYK Additives & Instruments; TEGO Rad 2010, TEGO Rad 2011, TEGO Rad 2100, TEGO Rad 2200N, TEGO Rad 2250, TEGO Rad 2300, TEGO Rad 2500, TEGO Rad 2600, TEGO Rad 2650, and TEGO Rad 2700 all of which are manufactured by Evonik Industries; and the like.

The content of the curable compound (B) is preferably in a range of 1% by mass to 50% by mass and more preferably in a range of 10% by mass to 40% by mass of all the solid contents of the composition of the present invention. The content of the curable compound (B) is preferably 1% by mass or higher and more preferably 10% by mass or higher of all the solid contents of the composition.

In the composition of the present invention, only one curable compound (B) may be used or two or more curable compounds may be jointly used. In a case in which the composition of the present invention includes two or more curable compounds (B), the total amount thereof is preferably within the above-described range.

<<Curable Compound (C)>>

The composition of the present invention preferably further includes a curable compound (C) other than the above-described curable compound (B).

Examples of the curable compound (C) include a curable compound which has one or more curable functional groups but does not have one or more atoms or groups selected from a fluorine atom, a silicon atom, a linear alkyl group having 8 or more carbon atoms, and a branched alkyl group having 3 or more carbon atoms.

As the curable compound (C), for example, a compound having an epoxy group, an oxetanyl group, an acrylate group, or the like can be used. The compound having an epoxy group or an oxetanyl group is specifically a polymer having an epoxy group in a side chain and a polymerizable monomer or oligomer having two or more epoxy groups in the molecule, and examples thereof include bisphenol A-type epoxy resins, bisphenol F-type epoxy resins, phenol novolac-type epoxy resins, cresol novolac-type epoxy resins, aliphatic epoxy resins, and the like. In addition, examples thereof also include monofunctional or polyfunctional glycidyl ether compounds.

The compound having an acrylate group is preferably a monofunctional (meth)acrylate, a bifunctional (meth)acrylate, or a tri- or higher-functional (meth)acrylate (for example, a tri- to hexafunctional (meth)acrylate).

Examples thereof include monofunctional acrylates or methacrylates such as polyethylene glycol mono(meth)acrylate, polypropylene glycol mono(meth)acrylate, and phenoxyethyl (meth)acrylate;

substances obtained by adding ethylene oxide or propylene oxide to a polyfunctional alcohol such as polyethylene glycol di(meth)acrylate, trimethylolethane tri(meth)acrylate, neopentyl glycol di(meth)acrylate, pentaerythritol tri(meth)acrylate, pentaerythritol tetra(meth)acrylate, dipentaerythritol penta(meth)acrylate, dipentaerythritol hexa(meth)acrylate, hexanediol (meth)acrylate, trimethylolpropane tri(acryloyloxypropyl) ether, tri(acryloyloxyethyl) isocyanurate, glycerin, or trimethylolethane and then (meth)acrylating the mixture; and polyfunctional acrylates or methacrylates such as urethane (meth)acrylates as respectively described in JP1973-41708B (JP-S48-41708B), JP1975-6034B (JP-S50-6034B), and JP1976-37193A (JP-S51-37193A), polyester acrylates respectively described in JP1973-64183A (JP-S48-64183A), JP1974-43191B (JP-S49-43191B), and JP1977-30490B (JP-S52-30490B), epoxy acrylates that are reaction products of an epoxy polymer and (meth)acrylic acid; and mixtures thereof.

Particularly, the compound having an acrylate group is preferably ethyleneoxy-denatured pentaerythritol tetraacrylate (NK ester ATM-35E as a commercially available product: manufactured by Shin-Nakamura Chemical Co., Ltd.), dipentaerythritol triacrylate (KAYARAD D-330 as a commercially available product; manufactured by Nippon Kayaku Co., Ltd.), dipentaerythritol tetraacrylate (KAYARAD D-320 as a commercially available product; manufactured by Nippon Kayaku Co., Ltd.), dipentaerythritol penta(meth)acrylate (KAYARAD D-310 as a commercially available product; manufactured by Nippon Kayaku Co., Ltd.), dipentaerythritol hexa(meth)acrylate (KAYARAD DPHA as a commercially available product; manufactured by Nippon Kayaku Co., Ltd.), or a structure in which the above-described (meth)acryloyl groups are bonded to each other through ethylene glycol or a propylene glycol residue. In addition, the oligomer types thereof can also be used.

Additionally, regarding commercially available products thereof, examples of the bisphenol A-type epoxy resins include JER827, JER828, JER834, JER1001, JER1002, JER1003, JER1055, JER1007, JER1009, and JER1010 (all manufactured by Mitsubishi Chemical Corporation), EPICLON860, EPICLON1050, EPICLON1051, and EPICLON1055 (all manufactured by DIC Corporation), and the like; examples of the bisphenol F-type epoxy resins include JER806, JER807, JER4004, JER4005, JER4007, and JER4010 (all manufactured by Mitsubishi Chemical Corporation), EPICLON830 and EPICLON835 (all manufactured by DIC Corporation), LCE-21 and RE-602S (all manufactured by Nippon Kayaku Co., Ltd.), and the like; examples of the phenol novolac-type epoxy resins include JER152, JER154, JER157S70, and JER157S65 (all manufactured by Mitsubishi Chemical Corporation), EPICLON N-740, EPICLON N-770, and EPICLON N-775 (all manufactured by DIC Corporation), and the like; examples of the cresol novolac-type epoxy resins include EPICLON N-660, EPICLON N-665, EPICLON N-670, EPICLON N-673, EPICLON N-680, EPICLON N-690, and EPICLON N-695 (all manufactured by DIC Corporation), EOCN-1020 (manufactured by Nippon Kayaku Co., Ltd.), and the like; and examples of the aliphatic epoxy resins include ADEKA RESIN EP-4080S, ADEKA RESIN EP-4085S, and ADEKA RESIN EP-4088S (all manufactured by Adeka Corporation), CELLOXIDE 2021P, CELLOXIDE 2081, CELLOXIDE 2083, CELLOXIDE 2085, EHPE 3150, EPO LEAD PB 3600, a EPO LEAD PB 4700, and the like (all manufactured by Daicel Corporation).

In addition, CYCLOMER P ACA 200M, CYCLOMER P ACA 230AA, CYCLOMER P ACA Z250, CYCLOMER P ACA Z251, CYCLOMER P ACA Z300, and CYCLOMER P ACA Z320 (all manufactured by Daicel Corporation) can also be used.

Furthermore, examples of the commercially available products of the compound having an acrylate group include polyfunctional aliphatic glycidyl ether compounds such as DENACOL EX-212L, EX-214L, EX-216L, EX-321L, and EX-850L (all manufactured by Nagase ChemteX Corporation) and the like. The above-described products are low-chlorine products and EX-212, X-214, EX-216, EX-321, EX-850, and the like, which are not low-chlorine products, can also be used in a similar manner.

Additionally, examples thereof include ADEKA RESIN EP-4000S, ADEKA RESIN EP-4003S, ADEKA RESIN EP-4010S, and ADEKA RESIN EP-4011S (all manufactured by Adeka Corporation), NC-2000, NC-3000, NC-7300, XD-1000, EPPN-501, and EPPN-502 (all manufactured by Adeka Corporation), JER1031S, and the like.

Regarding the curable compound (C), for example, Paragraphs "0466" to "0495" of JP2012-208494A ("0571" to "0606" in the specification of the corresponding US2012/0235099A) can be referred to, and the content thereof is incorporated into the present specification.

The content of the curable compound (C) is preferably an amount at which the total amount of the solid contents in the composition of the present invention falls in a range of 5% by mass to 80% by mass and more preferably an amount at which the amount thereof falls in a range of 5% by mass to 50% by mass. Only one curable compound (C) may be used, or two or more curable compounds may be jointly used.

<<Polymerization Initiator (D)>>

The composition of the present invention may include a polymerization initiator. The polymerization initiator is not particularly limited as long as the polymerization initiator has the capability of initiating the polymerization of the polymerizing compounds using either or both light and heat and can be appropriately selected depending on the purpose, but is preferably a photopolymerizing compound. In a case in which polymerization is initiated using light, the polymerization initiator preferably has sensitivity to light rays in an ultraviolet to visible light range. In addition, in a case in which polymerization is initiated using heat, a polymerization initiator that is decomposed at a temperature in a range of 150° C. to 250° C. is preferred.

The polymerization initiator that can be used in the present invention is preferably a compound having at least an aromatic group, and examples thereof include acylphosphine compounds, acetophenone-based compounds, α-aminoketone compounds, benzophenone-based compounds, benzoin ether-based compounds, ketal derivative compounds, thioxanthone compounds, oxime compounds, hexaaryl biimidazole compounds, trihalomethyl compounds, azo compounds, organic peroxides, diazonium compounds, iodonium compounds, sulfonium compounds, azinium compounds, onium salt compounds such as metallocene compounds, organic boron salt compounds, disulfone compounds, and the like.

From the viewpoint of sensitivity, oxime compounds, acetophenone-based compounds, α-aminoketone compounds, trihalomethyl compounds, hexaaryl biimidazole compounds, and thiol compounds are preferred.

Regarding the acetophenone-based compounds, the trihalomethyl compounds, the hexaaryl biimidazole compounds, and the oxime compounds, specifically, the description in Paragraphs "0506" to "0510" in JP2012-208494A ("0622" to "0628" in the specification of the corresponding US2012/0235099A) and the like can be referred to, and the content thereof is incorporated into the specification of the present application by reference.

The photopolymerization initiator is more preferably a compound selected from a group consisting of an oxime compound, acetophenone-based compounds, and an acylphosphine compound. More specifically, it is also possible to use, for example, the aminoacetophenone-based initiators described in JP1998-291969A (JP-H10-291969A), the acylphosphine oxide-based initiators described in JP4225898B, the above-described oxime-based initiators, and, furthermore, as the oxime-based initiators, the compounds described in JP2001-233842A.

As the oxime compound, it is possible to use a commercially available product IRGACURE-OXE01 (manufactured by BASF) or IRGACURE-OXE02 (manufactured by BASF). As the acetophenone-based initiator, it is possible to use commercially available products IRGACURE-907, IRGACURE-369, and IRGACURE-379 (trade names, all manufactured by BASF Japan). In addition, as the acylphosphine-based initiator, it is possible to use a commercially available product IRGACURE-819 or DAROCUR-TPO (trade names, all manufactured by BASF Japan).

The content of the polymerization initiator is preferably in a range of 0.01% by mass to 20% by mass and more preferably in a range of 0.1% by mass to 10% by mass of all the solid contents of the composition of the present invention. Only one polymerization initiator may be used or two or more polymerization initiators may be jointly used.

<<Curing Agent (E)>>

In the present invention, a curing agent may be used. As the curing agent, the curing agents and accelerators described in Chapter 3 of "Review Paper Fundamentals of Epoxy Resins I" published on Nov. 19, 2003 by the Japan Society of Epoxy Resin Technology can be preferably used, and, for example, a polyvalent carboxylic acid anhydride or a polyvalent carboxylic acid can be used.

Specific examples of the polyvalent carboxylic acid anhydride include aliphatic or alicyclic dicarboxylic anhydrides such as phthalic anhydride, itaconic acid anhydride, succinic anhydride, citraconic anhydride, dodecenyl succinic anhydride, tricarballylic anhydride, maleic anhydride, hexahydrophthalic anhydride, dimethyl tetrahydrophthalic anhydride, anhydrous himic acid, and vanadic anhydride; aliphatic polyvalent carboxylic acid dianhydrides such as 1,2,3,4-butanetetracarboxylic dianhydrides and cyclopentanetetracarboxylic dianhydrides; aromatic polyvalent carboxylic anhydrides such as pyromellitic anhydride, trimellitic anhydride, and benzophenone tetracarboxylic anhydride;

and ester group-containing acid anhydrides such as ethylene glycol bis-trimellitate and glycerine tris-trimellitate, and aromatic polyvalent carboxylic anhydrides are particularly preferred. In addition, an epoxy resin curing agent made of a commercially available carboxylic anhydride can also be preferably used.

In addition, specific examples of the polyvalent carboxylic acid that can be used in the present invention include aliphatic polyvalent carboxylic acids such as succinic acid, glutaric acid, adipic acid, butane tetracarboxylic acid, maleic acid, and itaconic acid; aliphatic polyvalent carboxylic acids such as hexahydrophthalic acid, 1,2-cyclohexane dicarboxylic acid, 1,2,4-cyclohexane tricarboxylic acid, and cyclopentane tetracarboxylic acid; and aromatic polyvalent carboxylic acids such as phthalic acid, isophthalic acid, terephthalic acid, pyromellitic acid, trimellitic acid, 1,4,5,8-naphthalene tetracarboxylic acid, and benzophenone tetracarboxylic acid, and the aromatic polyvalent carboxylic acids are preferred.

In addition, as the polyvalent carboxylic acid that can be used in the present invention, vinyl ether blocked carboxylic acid is preferably used. Specific examples thereof include the vinyl ether blocked carboxylic acids described in pages 193 and 194 of "Review Paper Fundamentals of Epoxy Resins I" published by the Japan Society of Epoxy Resin Technology, JP2003-66223A, and JP2004-339332A. When carboxylic acid is blocked using a vinyl ether, an addition reaction (esterification reaction) between carboxylic acid and an epoxy compound slowly proceeds at room temperature, and it is possible to suppress an increase in viscosity over time. In addition, the solubility in a variety of solvents, epoxy monomers, and epoxy resins is improved, and the production of a uniform formulation is possible. This vinyl ether blocked carboxylic acid is preferably jointly used with a thermal latent catalyst described below. When the vinyl ether blocked carboxylic acid is jointly used with a thermal latent catalyst, a deblocking reaction is accelerated during heating, the thickness of a film is reduced to a small extent during heating, and a color filter having a higher strength can be formed.

In addition, in the present invention, it is also possible to use a mixture of glycerine bisanhydrotrimellitate monoacetate and an alicyclic dicarboxylic anhydride. As a commercially available product thereof, for example, RIKACID MTA-15 (all manufactured by New Japan Chemical Co., Ltd.) can be used.

The amount of the curing agent formulated is preferably in a range of 0.01% by mass to 20% by mass and more preferably in a range of 0.1% by mass to 20% by mass of all the solid contents of the composition of the present invention. Only one curing agent may be used or a mixture of two or more curing agents may be used.

<<Solvent (F)>>

The composition of the present invention may include a solvent. The solvent is not particularly limited, can be appropriately selected depending on the purpose as long as the solvent is capable of uniformly dissolving or dispersing the respective components of the composition of the present invention, and preferred examples thereof include aqueous solvents such as water and alcohols. Furthermore, additionally, preferred examples of the solvent used in the present invention include organic solvents, ketones, ethers, esters, aromatic hydrocarbons, halogenated hydrocarbons, dimethylformamide, dimethylacetamide, dimethylsulfoxide, sulfolane, and the like. Only one solvent may be used, or two or more solvents may be jointly used.

Specific examples of the alcohols, the aromatic hydrocarbons, and the halogenated hydrocarbons include those described in Paragraph "0136" and the like of JP2012-194534A, and the content thereof is incorporated into the specification. In addition, specific examples of the esters, the ketones, and the ethers include those described in Paragraph "0497" of JP2012-208494A (Paragraph "0609" in the specification of the corresponding US2012/0235099A) and further include n-amyl acetate, ethyl propionate, dimethyl phthalate, ethyl benzoate, methyl sulfate, acetone, and methyl isobutyl ketone, diethyl ether, ethylene glycol monobutyl ether acetate, and the like.

Particularly, as the solvent, at least one solvent selected from cyclohexanone, propylene glycol monomethyl ether acetate, N-methyl-2-pyrrolidone, butyl acetate, ethyl lactate, and propylene glycol monomethyl ether is preferably used.

The content of the solvent is preferably 10% by mass or higher, more preferably 20% by mass or higher, still more preferably 30% by mass or higher, and particularly preferably 40% by mass or higher of the composition of the present invention. In addition, the content of the solvent is preferably 90% by mass or lower and more preferably 80% by mass or lower of the composition of the present invention. The content of the solvent is preferably an amount at which the total amount of the solid contents in the composition of the present invention falls in a range of 5% by mass to 60% by mass, more preferably an amount at which the amount thereof falls in a range of 5% by mass to 50% by mass, and still more preferably an amount at which the amount thereof falls in a range of 10% by mass to 40% by mass.

<<Polymerization Inhibitor>>

The composition of the present invention may further include a polymerization inhibitor. Only one polymerization inhibitor may be used or two or more polymerization inhibitors may be jointly used. Examples of the polymerization inhibitor include hydroquinone, p-methoxypehnol, di-t-butyl-p-cresol, pyrogallol, t-butylcatechol, benzoquinone, 4,4'-thiobis(3-methyl-6-t-butylphenol), 2,2'-methylenebis(4-methyl-6-t-butylphenol), N-nitrosophenyl hydroxyamine primary cerium salts, and the like.

The content of the polymerization inhibitor is preferably in a range of 0.01% by mass to 20% by mass and more preferably in a range of 0.1% by mass to 10% by mass of all the solid contents of the composition of the present invention. Only one polymerization inhibitor may be used or a mixture of two or more polymerization inhibitors may be used.

<<Surfactant>>

The composition of the present invention may include a surfactant other than the above-described curable compound (B), that is, a surfactant not having a curable group. For example, a variety of surfactants such as a fluorine-based surfactant, a nonionic surfactant, a cationic surfactant, an anionic surfactant, and a silicone-based surfactant can be used.

The content proportion of fluorine in the fluorine-based surfactant is preferably in a range of 3% by mass to 40% by mass, more preferably in a range of 5% by mass to 30% by mass, and particularly preferably in a range of 7% by mass to 25% by mass.

Examples of the fluorine-based surfactant include MEGAFAC F171, MEGAFAC F172, MEGAFAC F173, MEGAFAC F176, MEGAFAC F177, MEGAFAC F141, MEGAFAC F142, MEGAFAC F143, MEGAFAC F144, MEGAFAC R30, MEGAFAC F437, MEGAFAC F479, MEGAFAC F482, MEGAFAC F554, MEGAFAC F780, MEGAFAC R08 (all manufactured by DIC Corporation), FLUORAD FC430, FLUORAD FC431, FLUORAD FC171 (all manufactured by Sumitomo 3M, Ltd.), SURFLON S-382, SURFLON S-141, SURFLON S-145, SURFLON SC-101, SURFLON SC-103, SURFLON SC-104, SURFLON SC-105, SURFLON SC1068, SURFLON SC-381, SURFLON SC-383, SURFLON S393, SURFLON KH-40 (all manufactured by AGC Seimi Chemical Co., Ltd.), EFTOP EF301, EFTOP EF303, EFTOP EF351, EFTOP EF352 (all manufactured by Jemco Co., Ltd.), PF636, PF656, PF6320, PF6520, PF7002 (manufactured by OMNOVA Solution Inc.), and the like.

As the fluorine-based surfactant, a polymer having a fluoroaliphatic group can be used. Examples of the polymer having a fluoroaliphatic group include fluorine-based surfactants which have a fluoroaliphatic group and are obtained from a fluoroaliphatic compound manufactured using a telomerization method (also referred to as a telomer method) or an oligomerization method (also referred to as an oligomer method).

Here, the "telomerization method" refers to a method for synthesizing a compound having one or two active groups in a molecule by polymerizing substances with a low molecular weight. In addition, the "oligomerization method" refers to a method for converting a monomer or a mixture of monomers to an oligomer.

Examples of the fluoroaliphatic group in the present invention include a —$CF_3$ group, a —$C_2F_5$ group, a —$C_3F_7$ group, a —$C_4F_9$ group, a —$C_5F_{11}$ group, a —$C_6F_{13}$ group, a —$C_7F_{15}$ group, a —$C_8F_{17}$ group, a —$C_9F_{19}$ group, and a —$C_{10}F_{21}$ group, and, in terms of compatibility and coatability, a —$C_2F_5$ group, a —$C_3F_7$ group, a —$C_4F_9$ group, a —$C_5F_{11}$ group, a —$C_6F_{13}$ group, a —$C_7F_{15}$ group, and a —$C_8F_{17}$ group are preferred.

The fluoroaliphatic compound in the present invention can be synthesized using the method described in JP2002-90991A.

As the polymer having the fluoroaliphatic group in the present invention, a copolymer of a monomer having the fluoroaliphatic group in the present invention and (poly(oxyalkylene)) acrylate and/or (poly(oxyalkylene)) methacrylate can be used. This copolymer may be an irregularly-disposed copolymer or a block-copolymerized copolymer. In addition, examples of the poly(oxyalkylene) group include a poly(oxyethylene) group, a poly(oxypropylene) group, and a poly(oxybutylene) group, and the poly(oxyalkylene) group may be a unit having alkylene with different chain lengths in the same chain length such as a poly(block-linked body of oxyethylene, oxypropylene, and oxyethylene) group or a poly(block-linked body of oxyethylene and oxypropylene) group. Furthermore, the copolymer of the monomer having the fluoroaliphatic group and (poly(oxyalkylene)) acrylate (or methacrylate) may not be only a 2-membered copolymer but also a 3- or higher-membered copolymer obtained by copolymerizing two or more different monomers having a fluoroaliphatic group or two or more different (poly(oxyalkylene)) acrylates (or methacrylates) and the like at the same time.

As a commercially available surfactant including a polymer having a fluoroaliphatic group in the present invention, it is possible to use MEGAFAC F-781 (manufactured by DIC Corporation), a copolymer of an acrylate (or methacrylate) having a $C_6F_{13}$ group, (poly(oxyethylene)) acrylate (or methacrylate), and (poly(oxypropylene) acrylate (or methacrylate), a copolymer of an acrylate (or methacrylate) having a $C_8F_{17}$ group and (poly(oxyalkylene) acrylate (or methacrylate), a copolymer of an acrylate (or methacrylate) having a $C_8F_{17}$ group, (poly(oxyethylene)) acrylate (or methacrylate), and (poly(oxypropylene) acrylate (or methacrylate), or the like.

Specific examples of the nonionic surfactants include the nonionic surfactants described in Paragraph "0553" of JP2012-208494A ("0679" in the specification of the corresponding US2012/0235099A), and the contents thereof is incorporated into the present specification.

Specific examples of cationic surfactants include the cationic surfactants described in Paragraph "0554" in JP2012-208494A ("0680" in the specification of the corresponding US2012/0235099A), and the contents thereof is incorporated into the present specification.

Specific examples of the anionic surfactants include W004, W005, W017 (manufactured by Yusho Co., Ltd.), and the like.

Examples of silicone-based surfactants include the silicone-based surfactants described in Paragraph "0556" in JP2012-208494A ("0682" in the specification of the corresponding US2012/0235099A), and the content thereof is incorporated into the present specification. In addition, examples thereof also include "TORAY SILICONE SF8410", "TORAY SILICONE SF8427", "TORAY SILICONE SF8400", "ST80PA", "ST83PA", "ST86PA" manufactured by Dow Corning Toray Co., Ltd., "TSF-400", "TSF-401", "TSF-410", "TSF-4446", manufactured by Momentive Performance Materials Worldwide Inc., "KP321", "KP323", "KP324", "KP340" manufactured by Shin-Etsu Chemical Co., Ltd. and the like.

The content of the surfactant is preferably in a range of 0.01% by mass to 10% by mass and more preferably in a range of 0.05% by mass to 5% by mass of all the solid contents of the composition of the present invention. Only one surfactant may be used or two or more surfactants may be used.

<Other Components>

In the composition of the present invention, in addition to the above-described essential components or the above-described preferred additives, other components may be appropriately selected and used depending on the purpose as long as the effect of the present invention is not impaired.

Examples of other components that can be jointly used include a dispersing agent, a sensitizer, a curing accelerator, a filler, a thermal curing accelerator, a plasticizer, and the like. Regarding these components, for example, the descriptions in Paragraphs "0183" and thereafter of JP2012-003225A (the corresponding US2013/0034812A), Paragraphs "0101" and "0102", Paragraphs "0103" and "0104", and Paragraphs "0107" to "0109" of JP2008-250074A, Paragraphs "0159" to "0184" of JP2013-195480A, and the like can be referred to, and the contents thereof are incorporated into the present specification.

<Cured Film>

The composition of the present invention can be used as a cured film. The cured film of the present invention is a cured film including the near infrared-absorbing pigment (A) and one or more atoms or groups selected from a fluorine atom, a silicon atom, a linear alkyl group having 8 or more carbon atoms, and a branched alkyl group having 3 or more carbon atoms, in which the concentration of the atoms or groups on one film surface of the cured film is higher than the concentration of the atoms or groups in the entire film. According to the above-described cured film of the present invention, it is possible to suppress elution of the near infrared-absorbing pigment even when the cured film is immersed in a solvent as described above. Particularly, in the cured film of the present invention, the concentration of one or more atoms or groups selected from a fluorine atom, a silicon atom, a linear alkyl group having 8 or more carbon atoms, and a branched alkyl group having 3 or more carbon atoms in the entire film is preferably higher than the concentration of the atoms or groups in a region of 10% or less of the thickness from one film surface.

In addition, in the cured film of the present invention, the average concentration of the near infrared-absorbing pigment (A) in the entire film is preferably higher than the concentration of the near infrared-absorbing pigment (A) on the above-described film surface, that is, on one film surface on which the concentration of a fluorine atom, a silicon atom, a linear alkyl group having 8 or more carbon atoms, and a branched alkyl group having 3 or more carbon atoms is higher than the average concentration in the entire film. Particularly, in the cured film of the present invention, the concentration of the near infrared-absorbing pigment (A) in the region of 10% or less of the thickness from the film surface on which the concentration of the atoms or groups is high is preferably lower than the concentration of the near infrared-absorbing pigment (A) in the entire film.

The cured film of the present invention is a cured film including the above-described near infrared-absorbing pigment, in which, when the cured film is immersed in a solvent for five minutes, the retention percentage of the absorbance of the near infrared-absorbing pigment (A) at the maximum absorption wavelength before and after immersion, which is represented by the following expression, is 95% or higher.
Expression: (the absorbance of the near infrared-absorbing pigment (A) at the maximum absorption wavelength after immersion/the absorbance of the near infrared-absorbing pigment (A) at the maximum absorption wavelength before immersion)×100

A change in the absorbance before and after the immersion, which is represented by the above-described expression, being 95% or higher means that the near infrared-absorbing pigment in the cured film is not easily eluted into a solvent. The change in the absorbance before and after the immersion, which is represented by the above-described expression, is preferably 97% or higher, more preferably 99% or higher, and still more preferably 100%. The solvent is identical to the solvent described in the section of the solvent (F).

The thickness of the cured film is not particularly limited, can be appropriately selected depending on the purpose, and is, for example, preferably in a range of 1 μm to 300 μm, more preferably in a range of 1 μm to 100 μm, and still more preferably in a range of 1 μm to 50 μm.

The cured film of the present invention can be obtained using, for example, a method including applying the above-described composition of the present invention in a lamellar shape, irradiating the composition with active radioactive rays, and/or heating the composition.

Regarding a method for applying the composition of the present invention, the composition can be applied through coating or printing and is preferably applied through coating.

As a light source for exposure using active radioactive rays, a low-pressure mercury lamp, a high-pressure mercury lamp, an ultrahigh-pressure mercury lamp, a chemical lamp, an LED light source, an excimer laser generator, or the like can be used. The exposure amount is preferably in a range of 1 mJ/cm$^2$ to 500 mJ/cm$^2$.

The heating temperature is preferably in a range of 70° C. to 250° C. and more preferably in a range of 90° C. to 250° C.

The heating time is preferably in a range of 1 minute to 180 minutes and more preferably in a range of 2 minutes to 120 minutes.

An apparatus for heating is not particularly limited and can be appropriately selected from well-known apparatuses depending on the purpose, and examples thereof include a dry oven, a hot plate, an IR heater, and the like.

<Method for Manufacturing Near Infrared Cut Filter>

Since the composition of the present invention can be formed in a liquid phase, a near infrared cut filter can be easily manufactured using, for example, a manufacturing method including a step of forming a film by applying (preferably coating or printing and more preferably spin coating or applicator coating) the curable composition of the present invention onto a substrate in a lamellar shape and a step of forming a pattern image by exposing the lamellar curable composition through a mask and then developing the curable composition.

The method for manufacturing the near infrared cut filter of the present invention may include a step of forming an infrared-absorbing pattern by applying the above-described curable composition.

Regarding the infrared-absorbing pattern, a negative-type or positive-type infrared-absorbing pattern can be formed by, for example, applying a resist liquid onto a substrate, exposing the liquid through a predetermined mask pattern, and developing the liquid using a developer. Regarding the method for forming the above-described infrared-absorbing pattern, for example, Paragraphs "0140" to "0145" of JP2011-68731A (Paragraphs "0204" to "0216" in the specification of the corresponding US2011/0070407A) can be referred to, and the contents thereof are incorporated into the present specification.

In addition, the infrared-absorbing pattern can also be formed by forming a cured film for which the above-described curable composition is used, forming a photoresist layer in a cured film shape, removing the photoresist layer in a pattern shape so as to form a resist pattern, etching the cured film through dry etching using this resist pattern as an etching mask, and removing the resist pattern remaining after the etching. Regarding a method for forming the above-described infrared-absorbing pattern, for example, JP2008-241744A can be referred to, and the content thereof is incorporated into the present specification.

In the near infrared cut filter obtained using the composition of the present invention, the light transmittance thereof preferably satisfies at least one condition of the following conditions (1) to (9) and more preferably satisfies all the conditions (1) to (9).

(1) The light transmittance at a wavelength of 400 nm is preferably 70% or higher, more preferably 80% or higher, and still more preferably 90% or higher.

(2) The light transmittance at a wavelength of 450 nm is preferably 80% or higher, more preferably 85% or higher, and still more preferably 90% or higher.

(3) The light transmittance at a wavelength of 500 nm is preferably 70% or higher, more preferably 80% or higher, still more preferably 85% or higher, and particularly preferably 90% or higher.

(4) The light transmittance at a wavelength of 550 nm is preferably 80% or higher, more preferably 90% or higher, still more preferably 92% or higher, and particularly preferably 95% or higher.

(5) The light transmittance at a wavelength of 700 nm is preferably 30% or lower, more preferably 20% or lower, still more preferably 10% or lower, and particularly preferably 0.1% or lower.

(6) The light transmittance at a wavelength of 750 nm is preferably 30% or lower, more preferably 20% or lower, still more preferably 10% or lower, and particularly preferably 0.1% or lower.

(7) The light transmittance at a wavelength of 800 nm is preferably 30% or lower, more preferably 20% or lower, still more preferably 10% or lower, and particularly preferably 0.1% or lower.

(8) The light transmittance at a wavelength of 850 nm is preferably 30% or lower, more preferably 20% or lower, still more preferably 10% or lower, and particularly preferably 0.1% or lower.

(9) The light transmittance at a wavelength of 900 nm is preferably 50% or lower, more preferably 40% or lower, still more preferably 30% or lower, and particularly preferably 20% or lower.

The film thickness of the near infrared cut filter can be appropriately selected depending on the purpose, is preferably 20 µm or smaller, more preferably 10 µm or smaller, and still more preferably 5 µm or smaller. The lower limit of the film thickness is, for example, preferably 0.1 µm or larger, more preferably 0.2 µm or larger, and still more preferably 0.3 µm or larger.

In the near infrared cut filter, the visible light transmittance at a film thickness of 20 µm or smaller is preferably 75% or higher in the entire wavelength range of 400 nm to 550 nm. According to the present invention, it is possible to ensure a high transmittance in a wide visible light range and to provide a near infrared cut filter having strong near infrared-shielding properties.

The near infrared cut filter is used for a lens (a camera lens in a digital camera, a mobile phone, an in-vehicle camera, or the like or an optical lens such as a f-θ lens or a pickup lens) and an optical filter for a semiconductor light-receiving element which have a function of absorbing and cutting near infrared rays, a near infrared-absorbing film or a near infrared-absorbing sheet which shields heat rays for energy savings, an agricultural coating agent which aims to selectively use sunlight, a recording medium which uses the absorption heat of near infrared rays, a near infrared filter for an electronic device or a photograph, protective glasses, sunglasses, a heat-shielding film, an optical letter-reading record, the prevention of copying a confidential document, an electrophotographic photoreceptor, laser fusion, and the like. In addition, the near infrared cut filter is also useful for a noise cut filter for a CCD camera and a filter for a CMOS image sensor.

In addition, the present invention also relates to a method for manufacturing a near infrared cut filter including a step of applying the curable composition of the present invention on a substrate in a lamellar shape and a step of drying the composition. The film thickness, the laminate structure, and the like can be appropriately selected depending on the purpose.

The substrate may be a transparent substrate made of glass, a solid-state imaging element, another substrate provided on the light-receiving side of the solid-state imaging element (for example, a glass substrate 30 described below), or a layer such as a flattening layer provided on the light-receiving side of the solid-state imaging element.

The near infrared cut filter can be formed using a method such as, for example, a dropwise addition method (drop casting), spin coating, slit spin coating, slit coating, screen printing, applicator application, or the like. In the case of the dropwise addition method (drop casting), it is preferable to form a region to which the composition is added dropwise including a photoresist as a partition wall on a glass substrate so that a uniform film can be obtained with a predetermined film thickness. Meanwhile, the film thickness is capable of adjusting the amount of the composition added dropwise, the concentration of solid contents, and the area of the dropwise addition region.

In addition, the conditions for drying the coated film vary depending on the kind and proportions of individual components and the solvent; however, generally, the coated film is dried at a temperature in a range of 60° C. to 200° C. for approximately 30 seconds to 15 minutes.

A method for forming a near infrared cut filter using the curable composition of the present invention may include other steps. The steps are not particularly limited, can be appropriately selected depending on the purpose, and examples thereof include a surface treatment step of a base material, a pretreatment step (prebaking step), a curing treatment step, a post heating step (post baking step), and the like.

<Preheating Step and Post Heating Step>

The heating temperatures in the preheating step and the post heating step are generally in a range of 80° C. to 200° C. and preferably in a range of 90° C. to 180° C.

The heating times in the preheating step and the post heating step are generally in a range of 30 seconds to 400 seconds and preferably in a range of 60 seconds to 300 seconds.

<Curing Treatment Step>

The curing treatment step refers to a step of carrying out a curing treatment on the formed film as necessary and the curing treatment improves the mechanical strength of the near infrared cut filter.

The curing treatment step is not particularly limited, can be appropriately selected depending on the purpose, and preferred examples thereof include a full-surface exposure treatment, a full-surface thermal treatment, and the like. In the present invention, the meaning of "exposure" includes the irradiation with radioactive rays such as electron beams or X-rays as well as light rays having a variety of wavelengths.

The exposure is preferably carried out through irradiation with radioactive rays, and, as the radioactive rays that can be used in the exposure, particularly, ultraviolet rays such as electron beams, KrF, ArF, g-rays, h-rays, and i-rays or visible light rays are preferably used. Preferably, KrF, g-rays, h-rays, and i-rays are preferred.

Examples of an exposure method include stepper exposure, aligner exposure, exposure using a high-pressure mercury lamp, and the like.

The exposure amount is preferably in a range of 5 mJ/cm$^2$ to 3000 mJ/cm$^2$, more preferably in a range of 10 mJ/cm$^2$ to 2000 mJ/cm$^2$, and particularly preferably in a range of 100 mJ/cm$^2$ to 1000 mJ/cm$^2$.

Examples of a method for the full-surface exposure treatment include a method in which the full surface of the formed film is exposed. In a case in which the curable composition includes a polymerizing compound, the full-surface exposure accelerates the curing of a polymerizing component in the film formed of the composition, further cures the film, and improves mechanical strength and durability.

An apparatus for carrying out the full-surface exposure is not particularly limited, can be appropriately selected depending on the purpose, and preferred examples thereof include a UV stepper such as an ultrahigh-pressure mercury lamp.

In addition, examples of a method for the full-surface thermal treatment include a method in which the full surface of the formed film is heated. The heating of the full surface increases the film strength of a pattern.

The heating temperature during the full-surface heating is preferably in a range of 120° C. to 250° C. When the heating temperature is 120° C. or higher, the film strength is improved by the heating treatment and, when the heating temperature is 250° C. or lower, components in the film are decomposed, and it is possible to prevent the film from becoming weak and brittle.

The heating time in the full-surface heating is preferably in a range of 3 minutes to 180 minutes and more preferably in a range of 5 minutes to 120 minutes.

An apparatus for carrying out the full-surface heating is not particularly limited, can be appropriately selected from well-known apparatuses depending on the purpose, and examples thereof include a dry oven, a hot plate, an IR heater, and the like.

In addition, the present invention also relates to a camera module having a solid-state imaging element and a near infrared cut filter. In this camera module, the near infrared cut filter is the above-described near infrared cut filter.

In addition, the present invention also relates to a method for manufacturing a camera module including a solid-state imaging element and a near infrared cut filter disposed on a light-receiving side of the solid-state imaging element, including a step of forming the near infrared cut filter by applying the curable composition according of the present invention on the light-receiving side of the solid-state imaging element. In the camera module according to the present embodiment, the near infrared cut filter can be formed by, for example, applying the curable composition of the present invention onto the flattening layer so as to form a film. A method for forming the near infrared cut filter is as described above.

Hereinafter, a camera module according to an embodiment of the present invention will be described with reference to FIGS. 1 and 2, but the present invention is not limited to the following specific example.

Meanwhile, in FIGS. 1 and 2, common reference signs will be given to common portions.

In addition, in the description, "up", "upward", and "upside" indicate a side far from a silicon substrate 10, and "down", "downward", and "downside" indicate a side close to the silicon substrate 10.

FIG. 1 is a schematic sectional view illustrating the constitution of a camera module including a solid-state imaging element.

A camera module 200 illustrated in FIG. 1 is connected to a circuit board 70 which is a mounting substrate through solder balls 60 which are connection members.

In detail, the camera module 200 includes a solid-state imaging element (solid-state imaging element substrate) 100 including imaging element portions (imaging elements) 12 on a first main surface of the silicon substrate, a flattening layer (not illustrated in FIG. 1) provided on the first main surface side (light-receiving side) of the solid-state imaging element 100, a near infrared cut filter 42 provided on the flattening layer, a lens holder 50 which is disposed above the near infrared cut filter 42 and includes an imaging lens 40 in an inner space, and a light and electromagnetic shield 44 disposed so as to cover the surroundings of the solid-state imaging element 100 and the glass substrate 30. Meanwhile, the glass substrate 30 (light-transmitting substrate) may be provided on the flattening layer. The respective members are adhered together using an adhesive 45.

The present invention also relates to a method for manufacturing a camera module including the solid-state imaging element 100 and the near infrared cut filter 42 disposed on the light-receiving side of the solid-state imaging element, including a step of forming the film 42 by applying the curable composition of the present invention to the light-receiving side of the solid-state imaging element. In the camera module according to the present embodiment, the near infrared cut filter 42 can be formed on the flattening layer by, for example, applying the curable composition of the present invention so as to form a film. The method for coating the near infrared cut filter is as described above.

In the camera module 200, an incidence ray hv from the outside sequentially transmits the imaging lens 40, the near infrared cut filter 42, the glass substrate 30, and the flattening layer, and then reaches the imaging element portion 12 in the solid-state imaging element 100.

The camera module 200 includes the near infrared cut filter directly on the flattening layer, but the near infrared cut filter may be directly provided on a micro lens without the flattening layer, the near infrared cut filter may be provided on the glass substrate 30, or the glass substrate 30 provided with the near infrared cut filter may be adhered to the camera module 30.

Figure 2:
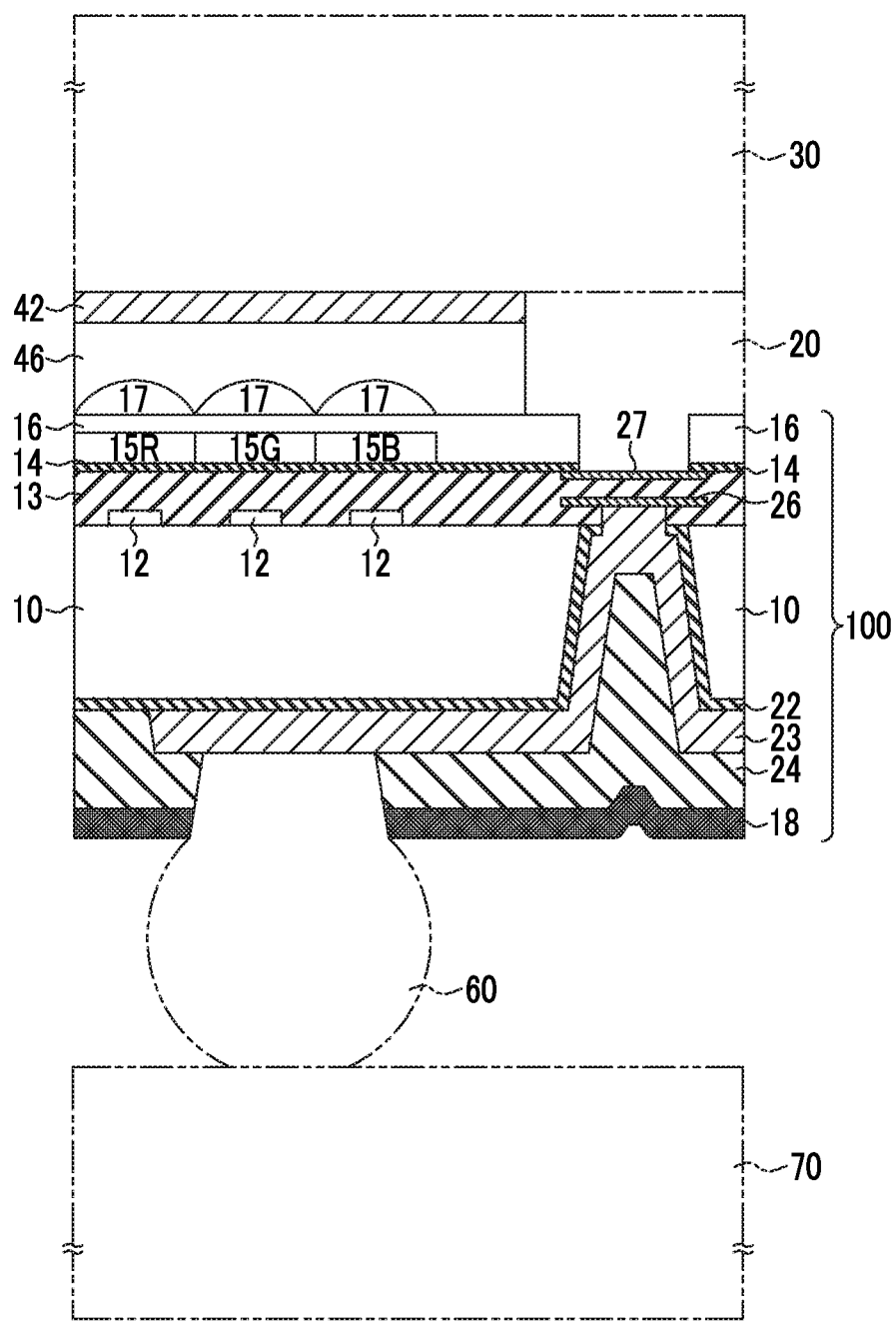
FIG. 2 is a schematic sectional view of the solid-state imaging element according to the embodiment of the present invention.

FIG. 2 is an enlarged sectional view of the solid-state imaging element 100 in FIG. 1.

The solid-state imaging element 100 includes the imaging element portions 12 on the first main surface of the silicon substrate 10 which is a base body, an interlayer insulating film 13, a base layer 14, a color filter 15, an overcoat 16, and micro lenses 17 in this order. A red color filter 15R, a green color filter 15G, and a blue color filter 15B (hereinafter, these will be collectively referred to as "color filter 15") or the micro lenses 17 are respectively disposed so as to correspond to the imaging elements 12. A light-shielding film 18, an insulating film 22, a metallic electrode 23, a solder resist layer 24, an inner electrode 26, and an element surface electrode 27 are provided on a second main surface which is on a side opposite to the first main surface of the silicon substrate 10. The respective members are adhered together using an adhesive 20.

A flattening layer 46 and the near infrared cut filter 42 are provided on the micro lenses 17. The near infrared cut filter 42 may be provided on the micro lenses 17 and between the base layer 14 and the color filter 15 or between the color filter 15 and the overcoat 16 instead of being provided on the flattening layer 46. Particularly, the near infrared cut filter is preferably provided at a position 2 mm or less (more preferably 1 mm or less) away from the surfaces of the micro lenses 17. When the near infrared cut filter is provided at this position, it is possible to simplify the step of forming the near infrared cut filter and to sufficiently cut unnecessary near infrared rays travelling toward the micro lenses, and thus the near infrared-shielding properties can be further enhanced.

Regarding the solid-state imaging element 100, the description of Paragraph "0245" and thereafter of JP2012-068418A (Paragraph "0407" in the specification of the corresponding US2012/068292A) can be referred to, and the content thereof is incorporated into the present specification.

The near infrared cut filter of the present invention can be subjected to a solder reflow step. When the camera module is manufactured through the solder reflow step, the automatic mounting of an electronic component-mounted substrate or the like which requires soldering becomes possible, and it is possible to significantly improve the productivity compared with a case in which the solder reflow step is not used. Furthermore, since the solder reflow step is automatically carried out, it is also possible to reduce the cost. In a case in which the near infrared cut filter is subjected to the solder reflow step, the near infrared cut filter is exposed to a temperature in a range of approximately 250° C. to 270° C., and thus the near infrared cut filter is preferably heat-resistant enough to withstand the solder reflow step (hereinafter, also referred to as "solder reflow resistance").

In the present specification, "having solder reflow resistance" means that the near infrared cut filter is capable of maintaining its characteristics before and after being heated at 200° C. for 10 minutes. More preferably, the infrared cut filter is capable of maintaining its characteristics before and after being heated at 230° C. for 10 minutes. Still more preferably, the infrared cut filter is capable of maintaining its characteristics before and after being heated at 250° C. for three minutes. In a case in which the near infrared cut filter does not have solder reflow resistance, when being held under the above-described conditions, there are cases in which the near infrared-absorbing properties of the near infrared cut filter degrade or the functions of the film become insufficient.

In addition, the present invention also relates to a method for manufacturing a camera module including a step of a reflow treatment. Even when the reflow step is provided, the near infrared cut filter of the present invention is capable of maintaining the near infrared-absorbing properties, and there are no cases in which the characteristics of the camera module having reduced size and weight and having improved performance are impaired.

Figure 3:
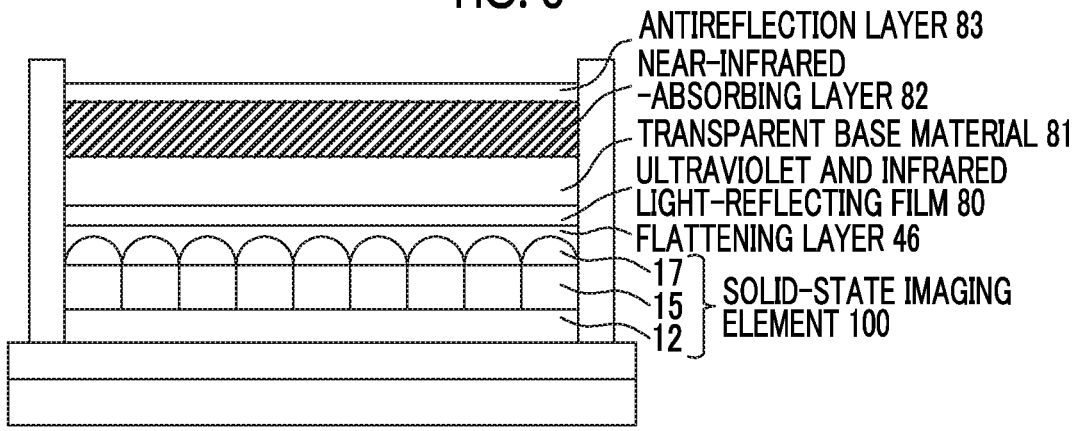
FIG. 3 is a schematic sectional view illustrating an example of a peripheral part of a near infrared cut filter in the camera module.
Figure 4:
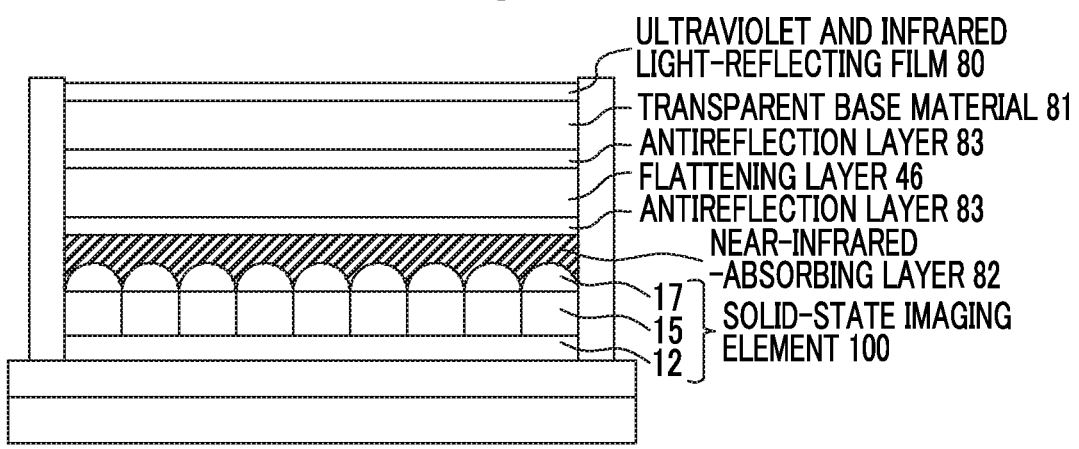
FIG. 4 is a schematic sectional view illustrating an example of the peripheral part of the near infrared cut filter in the camera module.
Figure 5:
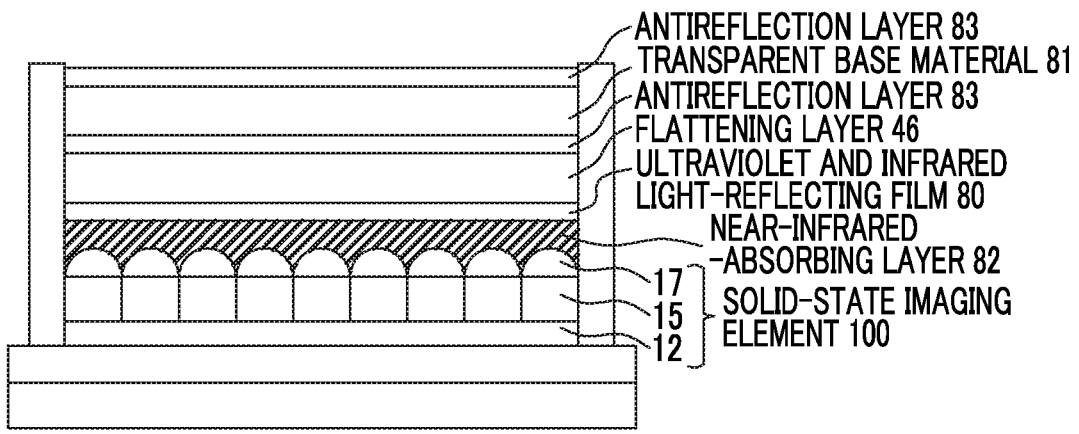
FIG. 5 is a schematic sectional view illustrating an example of the peripheral part of the near infrared cut filter in the camera module.

FIGS. 3 to 5 are schematic sectional views illustrating examples of a peripheral portion of the near infrared cut filter in the camera module.

As illustrated in FIG. 3, the camera module may have the solid-state imaging element 100, the flattening layer 46, an ultraviolet and infrared light-reflecting film 80, a transparent base material 81, a near infrared-absorbing layer 82, and an antireflection layer 83 in this order.

The ultraviolet and infrared light-reflecting film 80 has an effect of imparting and enhancing the functions of the near infrared cut filter, and, for example, Paragraphs "0033" to "0039" in JP2013-68688A can be referred to, and the content thereof is incorporated into the present specification.

The transparent base material 81 transmits light having wavelengths in the visible light range, and, for example, Paragraphs "0026" to "0032" in JP2013-68688A can be referred to, and the content thereof is incorporated into the present specification.

The near infrared-absorbing layer 82 is a layer formed by applying the above-described near infrared-absorbing composition of the present invention.

The antireflection layer 83 has a function of preventing the reflection of light incident on the near infrared cut filter so as to improve transmittance and of allowing efficient use of the incidence ray, and, for example, Paragraph "0040" in JP2013-68688A can be referred to, and the content thereof is incorporated into the present specification.

As illustrated in FIG. 4, the camera module may have the solid-state imaging element 100, the near infrared-absorbing layer 82, the antireflection layer 83, the flattening layer 46, the antireflection layer 83, the transparent base material 81, and the ultraviolet and infrared light-reflecting film 80 in this order.

As illustrated in FIG. 5, the camera module may have the solid-state imaging element 100, the near infrared-absorbing layer 82, the ultraviolet and infrared light-reflecting film 80, the flattening layer 46, the antireflection layer 83, the transparent base material 81, and the antireflection layer 83 in this order.

Thus far, the embodiment of the camera module has been described with reference to FIGS. 1 to 5, but the present invention is not limited to the embodiment of FIGS. 1 to 5.

EXAMPLES

Hereinafter, the present invention will be more specifically described using examples. Materials, amounts used, proportions, treatment contents, treatment orders, and the like described in the following examples can be appropriately changed within the scope of the gist of the present invention. Therefore, the scope of the present invention is not limited to specific examples described below. Meanwhile, in the following examples and a comparative example, unless particularly otherwise described, "%" and "parts" are on the basis of mass.

<Synthesis Example of Near Infrared-Absorbing Pigment (A)>

<<Synthesis of Exemplary Compound (A-154)>>

Exemplary Compound (A-154) was synthesized according to the following scheme.

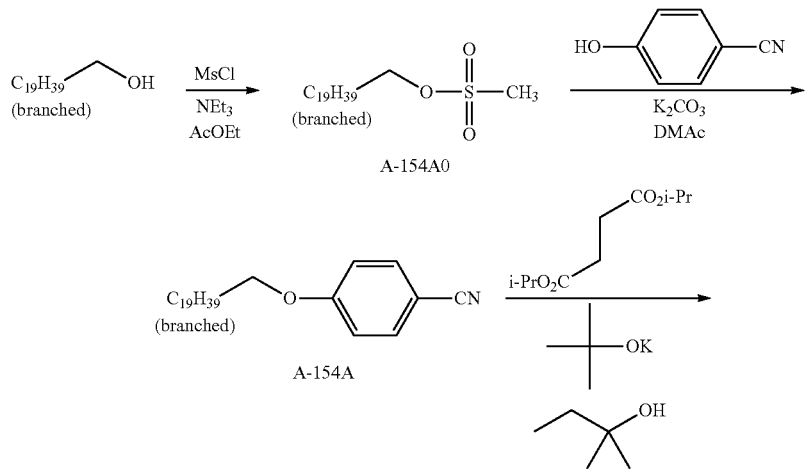

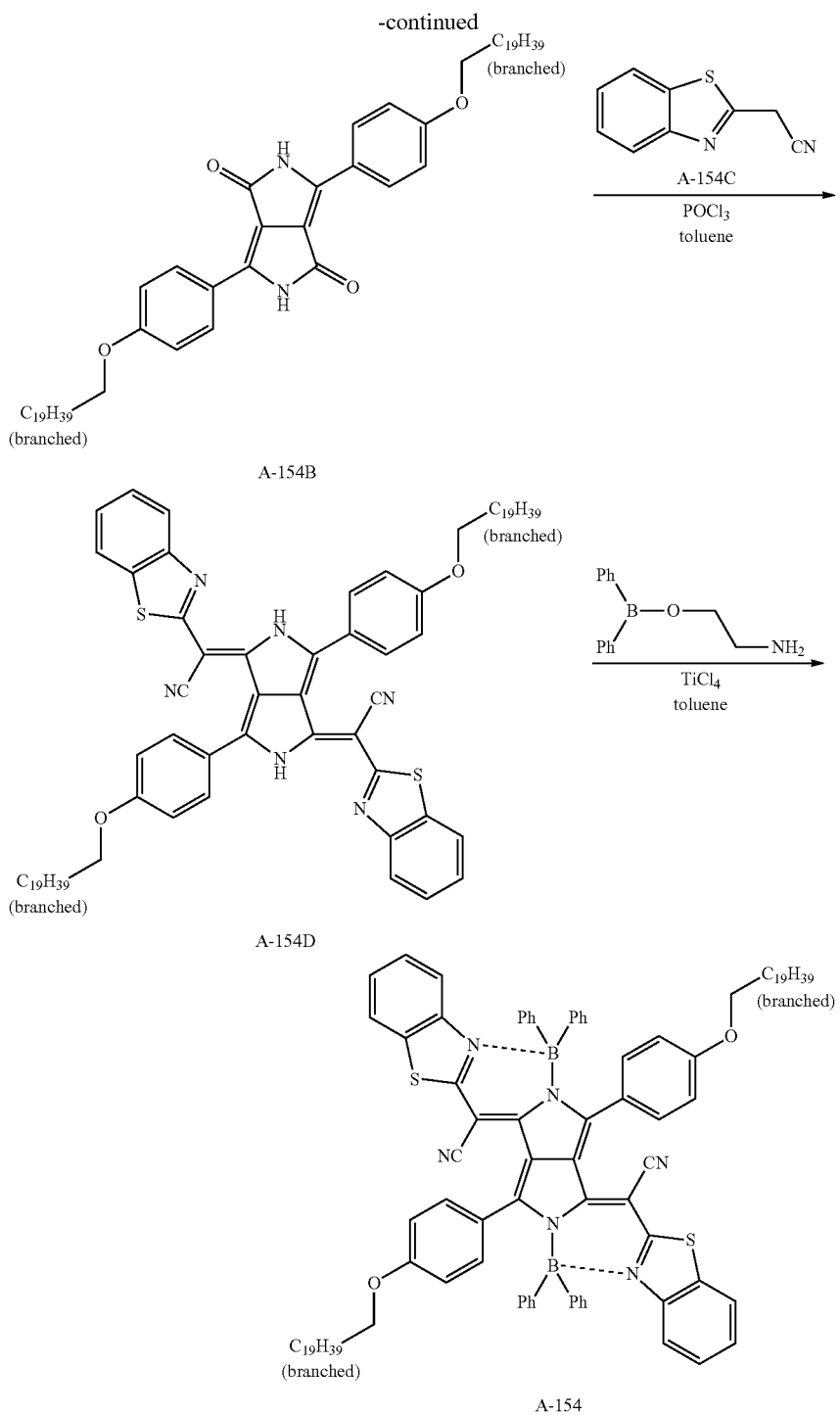

Isoeicosanol (20.0 parts by mass, FINEOXOCOL 2000, manufactured by Nissan Chemical Industries, Ltd.) and triethylamine (8.13 parts by mass) were stirred together in ethyl acetate (40 parts by mass), and methane sulfonyl chloride (8.44 parts by mass) was added dropwise thereto at −10° C. After the end of the dropwise addition, the components were reacted with each other for two hours at 30° C. An organic layer was removed through a separatory operation, and the solvent was distilled away under reduced pressure, thereby obtaining a light yellow liquid (A-154A0 body, 25.5 parts by mass).

4-Cyanophenol (7.82 parts by mass) and potassium carbonate (10.1 parts by mass) were stirred together in dimethyl acetamide (25 parts by mass), the D-154A0 body synthesized above (25.5 parts by mass) was added thereto, and the components were reacted with each other for six hours at 100° C. An organic layer was removed through a separatory operation, the organic layer was washed with an aqueous solution of sodium hydroxide, and then the solvent was distilled away under reduced pressure, thereby obtaining a light yellow liquid (A-154A body, 25.8 parts by mass).

¹H-NMR (CDCl3): δ 0.55-0.96 (m, 18H), 0.96-2.10 (m, 21H), 3.88 (m, 2H), 6.93 (d, 2H), 7.56 (d, 2H)

A diketo-pyrrolo-pyrrole compound (A-154B body) was synthesized using the A-154A body synthesized above (13.1 parts by mass) as a raw material according to the method described in U.S. Pat. No. 5,969,154A, thereby obtaining an orange solid (A-154B body, 7.33 parts by mass).

¹H-NMR (CDCl3): δ 0.55-0.96 (m, 36H), 0.96-2.10 (m, 42H), 3.95 (m, 4H), 7.06 (d, 4H), 8.30 (d, 4H), 8.99 (brs, 2H)

The A-154B body (7.2 parts by mass) and 2-(2-benzothiazolyl)acetonitrile (3.42 parts by mass) were stirred together in toluene (30 parts by mass), phosphorus oxychloride (10.0 parts by mass) was added thereto, and the components were heated and refluxed for five hours. An organic layer was removed through a separatory operation, the organic layer was washed with an aqueous solution of sodium hydrogen carbonate, and then the solvent was distilled away under reduced pressure.

The obtained crude product was purified through silica gel column chromatography (solvent: chloroform) and was further recrystallized using a chloroform/acetonitrile solvent, thereby obtaining a green solid (A-154D body, 5.73 parts by mass).

¹H-NMR (CDCl3): δ 0.55-1.00 (m, 36H), 1.00-2.10 (m, 42H), 3.97 (m, 4H), 7.11 (d, 4H), 7.28 (t, 2H), 7.43 (t, 2H), 7.67-7.75 (m, 6H), 7.80 (d, 2H), 13.16 (s, 2H)

Diphenylborinic acid 2-aminoethyl ester (2.53 parts by mass) and toluene (70 parts by mass) were stirred together at 40° C., titanium chloride (3.56 parts by mass) was added thereto, and the components were reacted with each other for 30 minutes. The A-154D body (5.60 parts by mass) was added thereto, and the components were heated and refluxed at an outer temperature of 130° C. for one hour. The components were cooled to room temperature, methanol (80 parts by mass) was added thereto so as to educe crystals, and the crystals were filtered. The obtained crude crystals were purified through silica gel column chromatography (solvent: chloroform) and then were further recrystallized using a chloroform/acetonitrile solvent, thereby obtaining a green crystal (A-154, 3.87 parts by mass) which was a target compound.

The λmax of the A-154 was 780 nm in chloroform. The molar absorption coefficient was 2.21×10⁵ dm³/mol·cm in chloroform.

¹H-NMR (CDCl3): δ 0.55-1.01 (m, 36H), 1.01-2.10 (m, 42H), 3.82 (m, 4H), 6.46 (s, 8H), 6.90-7.05 (m, 6H), 7.07-7.19 (m, 12H), 7.21-7.29 (m, 8H), 7.32 (d, 2H)

<Synthesis Example of Curable Compound (B)>

<<Synthesis of Exemplary Compound (B-1)>>

Cyclohexanone (33.26 parts by mass) was heated at 85° in a nitrogen stream. While stirring this liquid, a mixed solution of glycidyl methacrylate (22.36 parts by mass), 1,1,1,3,3,3-hexafluoroisopropyl methacrylate (12.38 parts by mass), cyclohexanone (33.26 parts by mass), and dimethyl 2,2'-azobisisobutyric acid (1.45 parts by mass) [V-601 manufactured by Wako Pure Chemical Industries, Ltd.] was added dropwise over two hours. After the end of the dropwise addition, the components were further stirred at 85° C. for two hours and at 90° C. for two hours, thereby obtaining a resin (B-1). The weight-average molecular weight (Mw: polystyrene-equivalent) of the obtained resin, which was obtained through GPC (carrier: tetrahydrofuran (THF)) was 13300, and the dispersity (Mw/Mn) thereof was 2.26.

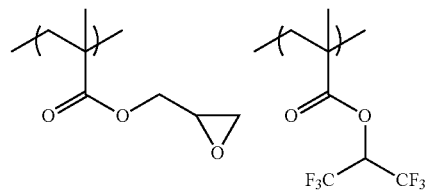

(B-1)

Resins B-2 to B-14 were synthesized in the same manner. Here, Resins B-1 to B-14 correspond to Exemplary Compounds B-1 to B-14 described in the section of the above-described curable compound (B).

<Preparation of Curable Composition>

<<Curable Composition of Example 1>>

The following components were mixed together, thereby preparing a curable composition of Example 1 shown in the following table.

| | |
|---|---|
| Near infrared-absorbing pigment (A): A-154 | 2.40 parts by mass |
| Curable compound (B): Polymer B-1 | 6.80 parts by mass |
| Curable compound (C): EHPE3150 (manufactured by Daicel Corporation) | 14.5 parts by mass |
| Curing agent (E): Pyromellitic anhydride | 3.50 parts by mass |
| Polymerization inhibitor: p-methoxyphenol | 0.10 parts by mass |
| Solvent: Cyclohexanone | 72.65 parts by mass |
| MEGAFAC F-781-F | 0.05 parts by mass |

<<Curable Compositions of Examples 2 to 15>>

Curable compositions of Examples 2 to 15 were prepared in the same manner as in Example 1.

<<Curable Composition of Example 16>>

The following components were mixed together, thereby preparing a curable composition of Example 16 shown in the following table.

| | |
|---|---|
| Near infrared-absorbing pigment (A): A-154 | 1.32 parts by mass |
| Curable compound (B): MEGAFAC RS-72-K (manufactured by DIC Corporation) | 10.4 parts by mass |
| Curable compound (C): CYCLOMER P (ACA) 230AA (manufactured by Daicel Corporation) | 6.78 parts by mass |
| Curable compound (C): KAYARAD DPHA (manufactured by Nippon Kayaku Co., Ltd.) | 2.54 parts by mass |
| Curable compound (C): EHPE3150 (manufactured by Daicel Corporation) | 2.54 parts by mass |
| Initiator (D): IRGACURE OXE01 (manufactured by BASF) | 1.46 parts by mass |
| Curing agent (E): Pyromellitic anhydride | 72 parts by mass |
| Polymerization inhibitor: p-methoxyphenol | 0.10 parts by mass |
| Solvent: Cyclohexanone | 74.2 parts by mass |

<<Curable Compositions of Examples 17 to 35 and Comparative Example>>

Curable compositions of Examples 17 to 35 and the comparative example were prepared in the same manner as in Example 16.

References in the following table are as described below.
C-1: EHPE3150 (manufactured by Daicel Corporation)
C-2: JER157S65 (manufactured by Mitsubishi Chemical Corporation)
C-3: Polymer having the following structure (Mw: 13200, Mw/Mn: 1.69)
C-4: Polymer having the following structure (Mw: 23900, Mw/Mn: 2.16)

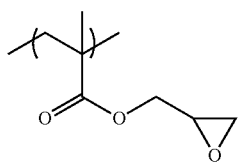
(C-3)

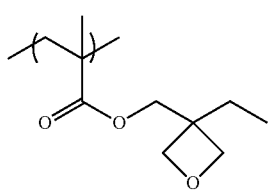
(C-4)

B-1 to B-14: Polymers in the above-described table
B-15: MEGAFAC RS-72-K (manufactured by DIC Corporation)
B-16: BYK-UV 3500 (manufactured by BYK Additives & Instruments)
B-17: TEGO Rad 2010 (manufactured by EVONIK Industries)
C-5: CYCLOMER P (ACA) 230AA (manufactured by Daicel Corporation)
C-6: KAYARAD DPHA (manufactured by Nippon Kayaku Co., Ltd.)
D-1: IRGACURE OXE01 (manufactured by BASF)
E-1: Pyromellitic anhydride (manufactured by Tokyo Chemical Industry Co., Ltd.)
E-2: RIKACID MTA-15 (manufactured by New Japan Chemical Co., Ltd.)
F-1: Cyclohexanone
F-2: PGMEA
F-3: N-Methyl-2-pyrrolidone
F-4: Butyl acetate
F-5: Ethyl lactate
F-6: Propylene glycol monomethyl ether Exemplary Compound 1: The following compound described in JP1995-164729A (JP-H07-164729A)

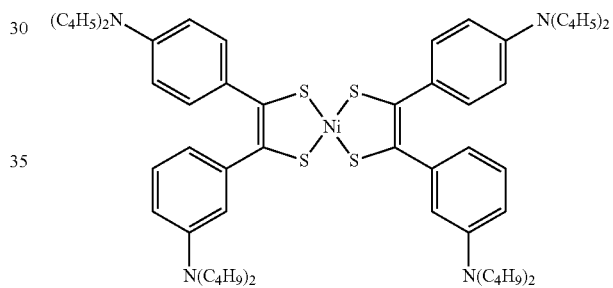

Exemplary Compound 2: The following compound described in JP1995-164729A (JP-H7-164729A)

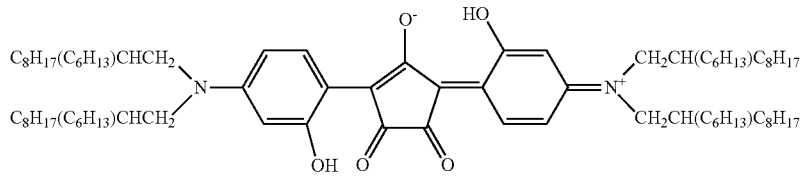

Exemplary Compound 3: The following compound described in JP2002-146254A

<Production of Cured Films>

Each of the curable compositions of Examples 1 to 15 was applied onto a glass substrate using a spin coating method and then was subjected to a curing treatment on a hot plate at 100° C. for two minutes and at 230° C. for five minutes, thereby obtaining an approximately 2.0 μm-thick cured film.

Each of the curable compositions of Examples 16 to 22 and the comparative example was applied onto a glass substrate using a spin coating method and then was heated on a hot plate at 100° C. for two minutes, thereby obtaining a infrared-curable composition coating layer. The obtained coating layer was exposed using an i-ray stepper or an aligner at an exposure amount in a range of 100 mJ/cm² to 1000 mJ/cm², and furthermore, the exposed coating layer B: The value of the above-described expression is 80% or higher C: The value of the above-described expression is lower than 80%

TABLE 3

|  | Near infrared-absorbing pigment (A) | Curable compound (B) | Curable compound (C) | Initiator (D) | Curing agent (E) | Solvent (F) | Solvent resistance Kind of solvent | Evaluation |
|---|---|---|---|---|---|---|---|---|
| Example 1 | A-154 | B-1 | C-1 | — | E-1 | F-1 | F-2 | A |
| Example 2 | A-154 | B-2 | C-1 | — | E-1 | F-1 | F-2 | A |
| Example 3 | A-154 | B-3 | C-1 | — | E-1 | F-1 | F-2 | A |
| Example 4 | A-154 | B-4 | C-1 | — | E-1 | F-1 | F-2 | A |
| Example 5 | A-154 | B-9 | C-1 | — | E-1 | F-1 | F-2 | A |
| Example 6 | A-154 | B-10 | C-1 | — | E-1 | F-1 | F-2 | A |
| Example 7 | A-154 | B-11 | C-1 | — | E-1 | F-1 | F-2 | A |
| Example 8 | A-154 | B-12 | C-1 | — | E-1 | F-1 | F-2 | A |
| Example 9 | A-154 | B-13 | C-1 | — | E-1 | F-1 | F-2 | B |
| Example 10 | A-154 | B-14 | C-1 | — | E-1 | F-1 | F-2 | B |
| Example 11 | A-154 | B-1 | C-2 | — | E-1 | F-1 | F-2 | A |
| Example 12 | A-154 | B-1 | C-3 | — | E-1 | F-1 | F-2 | A |
| Example 13 | A-154 | B-1 | C-4 | — | E-1 | F-1 | F-2 | A |
| Example 14 | A-154 | B-2 | C-4 | — | E-1 | F-1 | F-2 | A |
| Example 15 | A-154 | B-1 | C-1 | — | E-2 | F-1 | F-2 | B |
| Example 16 | A-154 | B-15 | C-1/C-5/C-6 | D-1 | E-1 | F-1 | F-2 | A |
| Example 17 | A-154 | B-16 | C-1/C-5/C-6 | D-1 | E-1 | F-1 | F-2 | A |
| Example 18 | A-154 | B-17 | C-1/C-5/C-6 | D-1 | E-1 | F-1 | F-2 | A |
| Example 19 | A-154 | B-15 | C-2/C-5/C-6 | D-1 | E-1 | F-1 | F-2 | A |
| Example 20 | A-154 | B-15 | C-3/C-5/C-6 | D-1 | E-1 | F-1 | F-2 | A |
| Example 21 | A-154 | B-15 | C-4/C-5/C-6 | D-1 | E-1 | F-1 | F-2 | A |
| Example 22 | A-154 | B-15 | C-5/C-6 | D-1 | — | F-1 | F-2 | B |
| Example 23 | A-154 | B-1 | C-1 | — | E-1 | F-1 | F-1 | A |
| Example 24 | A-154 | B-1 | C-1 | — | E-1 | F-1 | F-3 | A |
| Example 25 | A-154 | B-1 | C-1 | — | E-1 | F-1 | F-4 | A |
| Example 26 | A-154 | B-1 | C-1 | — | E-1 | F-1 | F-5 | A |
| Example 27 | A-154 | B-1 | C-1 | — | E-1 | F-1 | F-6 | A |
| Example 28 | A-154 | B-15 | C-1/C-5/C-6 | D-1 | E-1 | F-1 | F-1 | A |
| Example 29 | A-154 | B-15 | C-1/C-5/C-6 | D-1 | E-1 | F-1 | F-3 | A |
| Example 30 | A-154 | B-15 | C-1/C-5/C-6 | D-1 | E-1 | F-1 | F-4 | A |
| Example 31 | A-154 | B-15 | C-1/C-5/C-6 | D-1 | E-1 | F-1 | F-5 | A |
| Example 32 | A-154 | B-15 | C-1/C-5/C-6 | D-1 | E-1 | F-1 | F-6 | A |
| Example 33 | Exemplary Compound 1 | B-2 | C-1 | — | E-1 | F-1 | F-2 | A |
| Example 34 | Exemplary Compound 2 | B-15 | C-1/C-5/C-6 | D-1 | E-1 | F-1 | F-2 | A |
| Example 35 | Exemplary Compound 3 | B-1 | C-1 | — | E-1 | F-1 | F-2 | A |
| Comparative Example | A-1 | — | C-1/C-3 | D-1 | — | F-1 | F-2 | C | was subjected to a curing treatment on the hot plate at 230° C. for five minutes, thereby obtaining an approximately 2.0 μm-thick cured film.

<Evaluation of Near Infrared-Shielding Properties>

Figure 6:
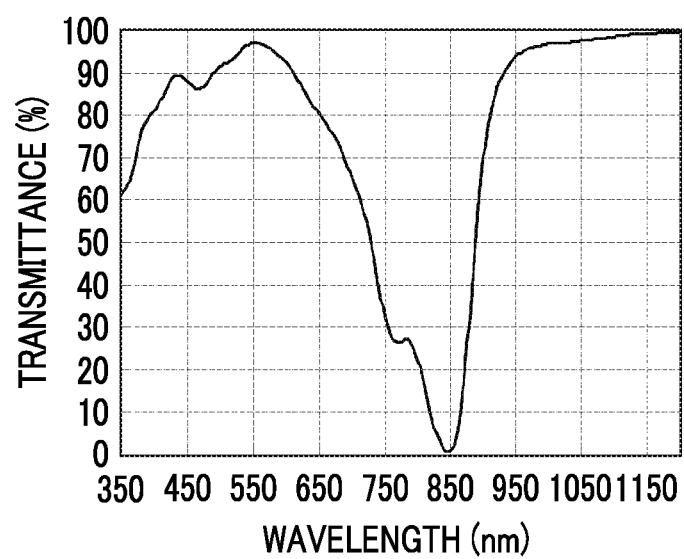
FIG. 6 is a view illustrating a spectral transmittance of a cured film of the present invention.

The spectral transmittance of the cured film of Example 1, which had been produced as described above, was measured using a spectrophotometer U-4100 (manufactured by Hitachi High-Technologies Corporation). The obtained spectral spectrum is illustrated in FIG. 6. In addition, for the cured films of Examples 2 to 35 as well, the spectral transmittances were measured in the same manner as in Example 1.

<Evaluation of Solvent Resistance>

The cured films produced above were immersed in a solvent shown in Table 3 for five minutes, and the solvent resistance was evaluated by comparing the spectra before and after the immersion using the following expression. The spectrums were obtained by measuring the absorbance at 865 nm and an incidence angle of 0° using a spectroscope UV4100 manufactured by Hitachi High-Technologies Corporation.

Expression: (absorbance after immersion/absorbance before immersion)×100

A: The value of the above-described expression is 95% or higher

As is clear from the table, it has been found that, according to the present invention, it is possible to produce a cured film that does not easily allow a near infrared-absorbing pigment to be eluted even when the cured film is immersed in a solvent. In addition, it has been found that, according to the present invention, when a cured film is produced using the curable composition, strong near infrared-shielding properties can be maintained. Furthermore, in the cured films produced using the curable compositions of the examples, it is possible to set the light transmittance to 85% or higher in a wavelength range of 450 nm to 550 nm and set the light transmittance to 20% or lower in a wavelength range of 800 nm to 830 nm.

In the curable composition prepared in Example 1, even when the curable compound (C) is changed to an equal amount of KAYARAD D-330, D-320, D-310, DPHA, DPCA-20, DPCA-30, DPCA-60, or DPCA-120 (all manufactured by Nippon Kayaku Co., Ltd.), M-305, M-510, M-520, or M-460 (manufactured by Toagosei Co., Ltd.), A-TMMT (manufactured by Shin-Nakamura Chemical Co., Ltd.), SR-494 (manufactured by Sartomer Americas), DENACOL EX-212L (manufactured by Nagase ChemteX Corporation), or JER-157S65 (manufactured by Mitsubishi Chemical Corporation), a cured film (preferably a near infrared cut filter) can be obtained in the same manner as in Example 1. Even in this case, the same excellent effects as in Example 1 can be obtained.

In addition, in the curable compositions of Examples 1 to 35, even in a case in which the sum of the contents of the near infrared-absorbing pigments is set to 15% by mass, 20% by mass, 30% by mass, or 40% by mass of all the solid contents of the composition, the same excellent near infrared-shielding performance as in Examples 1 to 35 can be obtained.

Furthermore, in the curable compositions of Examples 1 to 35, even in a case in which the content of the solvent is set to 10% by mass, 20% by mass, 30% by mass, or 40% by mass, the same excellent coating properties as in Examples 1 to 35 can be obtained.

EXPLANATION OF REFERENCES

10: silicon substrate
12: imaging element
13: interlayer insulating film
14: base layer
15: color filter
16: overcoat
17: micro lens
18: light-shielding film
20: adhesive
22: insulating film
23: metal electrode
24: solder resist layer
26: inner electrode
27: element surface electrode
30: glass substrate
40: imaging lens
42: near infrared cut filter
44: light and electromagnetic shield
45: adhesive
46: flattening layer
50: lens holder
60: solder ball
70: circuit board
80: ultraviolet and infrared light-reflecting film
81: transparent base material
82: near infrared-absorbing layer
83: antireflection layer
100: solid-state imaging element
200: camera module

What is claimed is:
1. A curable composition comprising:
a near infrared-absorbing pigment (A); and
a curable compound (B) having one or more atoms or groups selected from fluorine atom, a silicon atom, a linear alkyl group having 8 or more carbon atoms, and a branched alkyl group having 3 or more carbon atoms,
wherein the near infrared-absorbing pigment (A) is a pigment selected from the group consisting of pyrrolopyrrole pigments, thiol complex-based compounds, squarylium-based pigments, and croconium compounds,
the curable compound (B) has a (meth)acryloyloxy group, and
the curable compound (B) is a polymer having at least a repeating unit represented by Formula (B1),

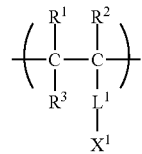

Formula (B1)

wherein in Formula (B1), each of $R^1$ to $R^3$ independently represents a hydrogen atom, an alkyl group, or a halogen atom, $L^1$ represents a divalent group which includes a group represented by —CONH—, and $X^1$ represents a (meth)acryloyloxy group.

2. The curable composition according to claim 1,
wherein the curable compound (B) has a fluorine atom and/or a branched alkyl group having 6 or more carbon atoms.

3. The curable composition according to claim 1,
wherein the curable compound (B) further has one or more curable functional groups selected from an epoxy group, an oxetanyl group, an isocyanate group, a hydroxyl group, an amino group, a carboxyl group, a thiol group, an alkoxysilyl group, a methylol group, a vinyl group, a (meth)acrylamide group, a styryl group, and a maleimide group.

4. The curable composition according to claim 3,
wherein the curable compound (B) further has one or more curable functional groups selected from an epoxy group and an oxetanyl group.

5. The curable composition according to claim 1,
wherein the curable compound (B) has two or more curable functional groups.

6. The curable composition according to claim 1,
wherein the curable compound (B) contains a repeating unit represented by Formula (B2) below;

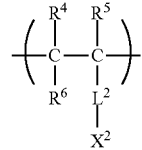

Formula (B2)

in Formula (B2), each of $R^4$ to $R^6$ independently represents a hydrogen atom, an alkyl group, or a halogen atom, $L^2$ represents a single bond or a divalent linking group, $X^2$ represents an alkyl group substituted with a fluorine atom, an aryl group substituted with a fluorine atom, an alkylsilyl group, an arylsilyl group, a group having the following partial structure (S), a linear alkyl group having 8 or more carbon atoms, or a branched alkyl group having 3 or more carbon atoms;

Partial structure (S)

\* represents a bonding site to other atoms.

7. The curable composition according to claim 1,
wherein the content of the curable compound (B) is in a range of 1% by mass to 50% by mass of all solid contents of the curable composition.

8. The curable composition according to claim 1, further comprising:
a curable compound (C) which is different from the curable compound (B).

9. The curable composition according to claim 1, wherein a maximum absorption wavelength of the near infrared-absorbing pigment (A) is in a range of 700 nm to 1000 nm.

10. The curable composition according to claim 1, wherein the near infrared-absorbing pigment (A) has a hydrophobic group.

11. The curable composition according to claim 1, wherein the near infrared-absorbing pigment (A) has a site having a C Log P of 5.3 or higher.

12. The curable composition according to claim 1, wherein the near infrared-absorbing pigment (A) has a hydrocarbon group having a C Log P of 5.3 or higher.

13. The curable composition according to claim 1, wherein the near infrared-absorbing pigment (A) is a pyrrolo-pyrrole pigment.

14. The curable composition according to claim 13, wherein the pyrrolo-pyrrole pigment is a compound represented by the following formula;

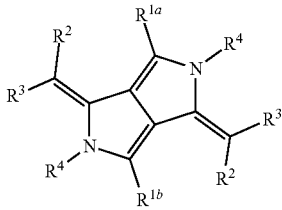

in the formula, each of $R^{1a}$ and $R^{1b}$ independently represents a substituent having an alkyl group, an aryl group, or a heteroaryl group; each of $R^2$ and $R^3$ independently represents a cyano group or a heterocyclic group; $R^4$ represents a hydrogen atom, an alkyl group, an aryl group, a heteroaryl group, substituted boron, or a metallic atom and may form a covalent bond or a coordination bond with at least one of $R^{1a}$, $R^{1b}$, and $R^3$.

15. The curable composition according to claim 1, further comprising:
at least one component selected from a polymerization initiator (D), a curing agent (E), and a solvent (F).

16. The curable composition according to claim 1, wherein the total amount of all solid contents in the curable composition is in a range of 5% by mass to 50% by mass.

17. A cured film formed using the curable composition according to claim 1.

18. A method for manufacturing a cured film comprising:
applying the curable composition according to claim 1 in a lamellar shape;
irradiating the curable composition with active radioactive rays; and/or heating the curable composition.

19. A near infrared cut filter formed using the curable composition according to claim 1.

20. A method for manufacturing a near infrared cut filter, comprising:
applying the curable composition according to claim 1 to a substrate in a lamellar shape; and
forming a pattern image by exposing the lamellar curable composition through a mask and then developing the curable composition.

21. A camera module comprising:
a solid-state imaging element and the near infrared cut filter according to claim 19.

22. A method for manufacturing a camera module including a solid-state imaging element and a near infrared cut filter, comprising:
forming the near infrared cut filter by applying the curable composition according to claim 1 on a light-receiving side of the solid-state imaging element.

23. The curable composition according to claim 1, wherein the weight-average molecular weight of the curable compound (B) is in a range of 5,000 to 100,000.

24. The curable composition according to claim 1, wherein the curable compound (B) has a fluorine atom.

25. The curable composition according to claim 1, wherein the near infrared-absorbing pigment (A) is a compound represented by Formula (A2),

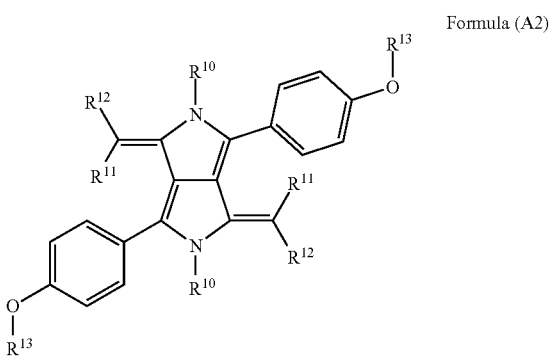

wherein in Formula (A2), each of $R^{10}$'s independently represents a hydrogen atom, an alkyl group, an aryl group, a heteroaryl group, substituted boron, or a metal atom and may form a covalent bond or a coordination bond with $R^{12}$; each of $R^{11}$ and $R^{12}$ independently represents a hydrogen atom or a substituent, at least one of $R^{11}$ and $R^{12}$ is an electron-withdrawing group, and $R^{11}$ and $R^{12}$ may bond to each other and thus form a ring; and each of R's independently represents a branched alkyl group having 3 to 30 carbon atoms.

26. The curable composition according to claim 1, wherein the near infrared-absorbing pigment (A) is a compound represented by Formula (A3),

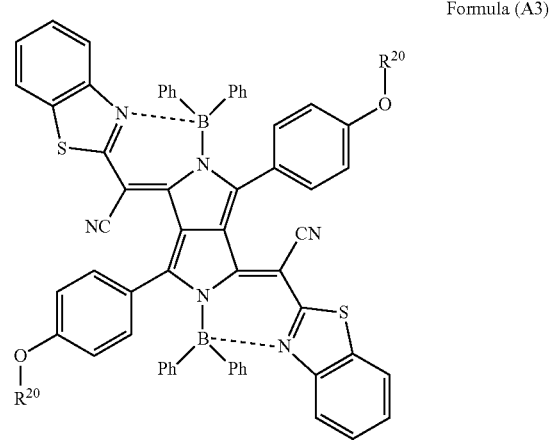

wherein in Formula (A3), each of $R^{20}$'s independently represents a branched alkyl group having 3 to 30 carbon atoms, and each Ph represents a phenyl group.

27. The curable composition according to claim 1, wherein the near infrared-absorbing pigment (A) is a pigment selected from the group consisting of pyrrolopyrrole pigments, copper compounds, and croconium compounds.

28. The curable composition according to claim 1, wherein the content of the near infrared-absorbing pigment (A) is in a range of 0.5% by mass to 15% by mass of all solid contents in the composition.

29. The curable composition according to claim 1, wherein $X^1$ represents an acryloyloxy group.

30. The curable composition according to claim 1, wherein the curable composition further comprises an oxime compound.

31. The curable composition according to claim 1, wherein the curable composition further comprises a curable compound (C) which is different from the curable compound (B), wherein the curable compound (C) contains a tri- or higher functional (meth)acrylate compound.

32. The curable composition according to claim 1, wherein $X^1$ represents an acryloyloxy group, and the near infrared-absorbing pigment (A) is a pyrrolopyrrole pigment represented by the following formula;

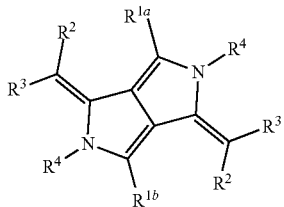

in the formula, each of $R^{1a}$ and $R^{1b}$ independently represents a substituent having an alkyl group, an aryl group, or a heteroaryl group; each of $R^2$ and $R^3$ independently represents a cyano group or a heterocyclic group; $R^4$ represents a hydrogen atom, an alkyl group, an aryl group, a heteroaryl group, substituted boron, or a metallic atom and may form a covalent bond or a coordination bond with at least one of $R^{1a}$, $R^{1b}$, and $R^3$.

* * * * *